United States Patent
Johnson et al.

(10) Patent No.: US 9,826,581 B2
(45) Date of Patent: Nov. 21, 2017

(54) VOLTAGE CONFIGURABLE SOLID STATE LIGHTING APPARATUSES, SYSTEMS, AND RELATED METHODS

(71) Applicant: Cree, Inc., Durham, NC (US)

(72) Inventors: Jeremy Allen Johnson, Fuquay Varina, NC (US); Andrew Dan Bendtsen, Racine, WI (US); Christopher P. Hussell, Cary, NC (US); Kurt S. Wilcox, Libertyville, IL (US); Craig William Hardin, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/961,439

(22) Filed: Dec. 7, 2015

(65) Prior Publication Data

US 2016/0165680 A1 Jun. 9, 2016

Related U.S. Application Data

(60) Provisional application No. 62/088,375, filed on Dec. 5, 2014, provisional application No. 62/108,425, filed on Jan. 27, 2015.

(51) Int. Cl.
*B60Q 1/26* (2006.01)
*H05B 33/08* (2006.01)
(Continued)

(52) U.S. Cl.
CPC .......... *H05B 33/0809* (2013.01); *F21K 9/00* (2013.01); *F21V 23/005* (2013.01);
(Continued)

(58) Field of Classification Search
CPC ....... H05B 33/08; F21V 23/00; F21V 29/004; F21V 15/01; F21S 4/001; F21S 4/003;
(Continued)

(56) References Cited

U.S. PATENT DOCUMENTS 4,946,547 A    8/1990    Palmour
5,200,022 A    4/1993    Kong
(Continued)

FOREIGN PATENT DOCUMENTS

CN    1436374 A    8/2003
CN    101794855    8/2010
(Continued)

OTHER PUBLICATIONS

"DuPont Ti-Pure titanium dioxide, Titanium Dioxide for Coatings," Jan. 2012, pp. 1-28, DuPont, USA.
(Continued)

*Primary Examiner* — Minh D A
(74) *Attorney, Agent, or Firm* — Jenkins, Wilson, Taylor & Hunt, P.A.

(57) ABSTRACT

Solid state lighting apparatuses, systems, and related methods are described. A solid state lighting apparatus includes an array of solid state light emitters arranged on or over the substrate and a plurality of driving components arranged on or over the substrate. The driving components are configured to independently activate and deactivate at least some of the solid state light emitters of the array of solid state light emitters during a portion of an alternating current (AC) cycle. A method of providing a solid state lighting apparatus includes providing a substrate, mounting an array of solid state light emitters on or over the substrate, and providing a plurality of driving components on or over the substrate. A solid state lighting system includes a solid state lighting apparatus having an array of solid state light emitters, driving components, and a rectifying circuit for rectifying current supplied to the driving components.

42 Claims, 16 Drawing Sheets

(51) Int. Cl.
*F21K 9/00* (2016.01)
*F21V 23/00* (2015.01)
*H01L 25/16* (2006.01)
*H05K 1/18* (2006.01)
*F21Y 115/10* (2016.01)
*F21Y 105/18* (2016.01)

(52) U.S. Cl.
CPC ........ *H05B 33/083* (2013.01); *F21Y 2105/18* (2016.08); *F21Y 2115/10* (2016.08); *H01L 25/167* (2013.01); *H01L 2224/48137* (2013.01); *H05K 1/181* (2013.01); *H05K 2201/1031* (2013.01); *H05K 2201/10106* (2013.01); *Y02P 70/611* (2015.11)

(58) Field of Classification Search
CPC ......... F21W 2121/00; F21W 2121/004; F21W 2131/103; F21Y 2101/02; F21K 9/00
USPC ....... 362/227, 232, 249.01, 249.02; 315/250, 315/252
See application file for complete search history.

(56) References Cited

U.S. PATENT DOCUMENTS

| | | |
|---|---|---|
| RE34,861 E | 2/1995 | Davis et al. |
| 5,493,393 A | 2/1996 | Beranek et al. |
| 6,600,175 B1 | 7/2003 | Baretz et al. |
| 6,661,081 B2 | 12/2003 | Miyaki et al. |
| 6,795,461 B1 | 9/2004 | Blair et al. |
| 6,874,910 B2 | 4/2005 | Sugimoto et al. |
| 7,329,942 B2 | 2/2008 | Tsou et al. |
| 7,648,775 B2 | 1/2010 | Wakako et al. |
| 7,714,334 B2 | 5/2010 | Lin |
| 7,791,061 B2 | 9/2010 | Edmond et al. |
| D626,666 S | 11/2010 | Yamamoto et al. |
| D627,493 S | 11/2010 | Yamamoto et al. |
| D628,312 S | 11/2010 | Yamamoto et al. |
| D628,318 S | 11/2010 | Yamamoto et al. |
| 7,825,422 B2 | 11/2010 | Maeda et al. |
| D628,722 S | 12/2010 | Yamamoto et al. |
| 7,927,901 B2 | 4/2011 | Fang et al. |
| D640,997 S | 7/2011 | Imai et al. |
| 7,989,840 B2 | 8/2011 | Sanpei et al. |
| 8,018,135 B2 | 9/2011 | Van de Ven et al. |
| 8,058,088 B2 | 11/2011 | Cannon |
| 8,115,369 B2 | 2/2012 | Kang et al. |
| 8,167,674 B2 | 5/2012 | Hussell et al. |
| 8,188,687 B2 | 5/2012 | Lee et al. |
| 8,304,660 B2 | 11/2012 | Tuan et al. |
| 8,408,748 B2 | 4/2013 | Janik et al. |
| 8,410,679 B2 | 4/2013 | Ibbetson et al. |
| 8,415,693 B2 | 4/2013 | Inobe et al. |
| 8,425,271 B2 | 4/2013 | Hussell et al. |
| 8,456,739 B2 | 6/2013 | Stuettler et al. |
| 8,476,836 B2 | 7/2013 | Van de Ven et al. |
| 8,508,140 B2 | 8/2013 | Leung et al. |
| 8,563,339 B2 | 10/2013 | Tarsa et al. |
| 8,564,000 B2 | 10/2013 | Hussell et al. |
| 8,624,271 B2 | 1/2014 | Reiherzer et al. |
| 8,629,476 B2 | 1/2014 | Inoguchi |
| D699,387 S | 2/2014 | Snell et al. |
| 8,643,271 B2 | 2/2014 | Shimonishi et al. |
| D700,737 S | 3/2014 | Campagna |
| D702,653 S | 4/2014 | Wilcox et al. |
| 8,692,281 B2 | 4/2014 | Su et al. |
| 8,704,446 B2 | 4/2014 | Gibbs |
| D705,181 S | 5/2014 | Hussell et al. |
| 8,766,313 B2 | 7/2014 | Kashitani et al. |
| D714,989 S | 10/2014 | Rowlette, Jr. |
| 8,895,998 B2 | 11/2014 | Hussell et al. |
| 8,940,561 B2 | 1/2015 | Donofrio et al. |
| D724,550 S | 3/2015 | Song |
| D724,552 S | 3/2015 | Lai et al. |
| 8,975,821 B2 | 3/2015 | Gershowitz et al. |
| 9,024,349 B2 | 5/2015 | Chitnis et al. |
| 9,024,350 B2 | 5/2015 | Loh |
| D732,487 S | 6/2015 | Lai et al. |
| D732,488 S | 6/2015 | Lai et al. |
| D736,725 S | 8/2015 | Wilcox et al. |
| D738,542 S | 9/2015 | Hussell et al. |
| 9,131,561 B2 | 9/2015 | Athalye |
| D741,538 S | 10/2015 | Ghasabi |
| 9,159,888 B2 | 10/2015 | Chitnis et al. |
| 9,172,012 B2 | 10/2015 | Andrews et al. |
| 9,277,605 B2 | 3/2016 | Ni |
| 9,538,590 B2 | 1/2017 | Hussell et al. |
| 2001/0002139 A1 | 5/2001 | Hiraoka |
| 2002/0047189 A1 | 4/2002 | Miyaki et al. |
| 2003/0189830 A1 | 10/2003 | Sugimoto et al. |
| 2004/0027761 A1 | 2/2004 | Fukui et al. |
| 2006/0186418 A1 | 8/2006 | Edmond |
| 2006/0261357 A1 | 11/2006 | Tsou et al. |
| 2007/0029664 A1 | 2/2007 | Mohammed et al. |
| 2007/0062433 A1 | 3/2007 | Hurwitz |
| 2007/0158668 A1 | 7/2007 | Tarsa |
| 2007/0252523 A1 | 11/2007 | Maeda et al. |
| 2008/0043444 A1 | 2/2008 | Hasegawa et al. |
| 2008/0055901 A1 | 3/2008 | Sanpei et al. |
| 2008/0173884 A1 | 7/2008 | Chitnis et al. |
| 2008/0179611 A1 | 7/2008 | Chitnis et al. |
| 2008/0211421 A1 | 9/2008 | Lee et al. |
| 2008/0258130 A1 | 10/2008 | Bergmann |
| 2009/0045428 A1 | 2/2009 | Lin |
| 2009/0184616 A1 | 7/2009 | Van de Ven et al. |
| 2009/0206718 A1 | 8/2009 | Shimonishi et al. |
| 2010/0015742 A1 | 1/2010 | Fang et al. |
| 2010/0078669 A1 | 4/2010 | Cho et al. |
| 2010/0155763 A1 | 6/2010 | Donofrio et al. |
| 2010/0212942 A1 | 8/2010 | Tuan et al. |
| 2010/0277069 A1 | 11/2010 | Janik et al. |
| 2011/0111537 A1 | 5/2011 | Cheng et al. |
| 2011/0170289 A1 | 7/2011 | Allen et al. |
| 2011/0193109 A1 | 8/2011 | Loh |
| 2011/0204409 A1 | 8/2011 | Sung et al. |
| 2011/0260200 A1 | 10/2011 | Chen |
| 2011/0267732 A1 | 11/2011 | Kuo |
| 2012/0032226 A1 | 2/2012 | Su et al. |
| 2012/0038285 A1 | 2/2012 | Leung et al. |
| 2012/0177909 A1 | 7/2012 | Uchino et al. |
| 2012/0193649 A1 | 8/2012 | Donofrio |
| 2012/0193662 A1 | 8/2012 | Donofrio |
| 2012/0217885 A1* | 8/2012 | Lee .................... H05B 33/0806 315/192 |
| 2012/0250310 A1 | 10/2012 | Hussell et al. |
| 2013/0069536 A1 | 3/2013 | Ni |
| 2013/0200406 A1 | 8/2013 | Hussell |
| 2013/0200420 A1 | 8/2013 | Hussell |
| 2013/0214674 A1 | 8/2013 | Inoguchi |
| 2013/0256710 A1 | 10/2013 | Andrews et al. |
| 2013/0258658 A1 | 10/2013 | Hussell |
| 2014/0063818 A1 | 3/2014 | Randolph |
| 2014/0168981 A1 | 6/2014 | VanStiphout et al. |
| 2014/0232288 A1 | 8/2014 | Brandes et al. |
| 2014/0232289 A1* | 8/2014 | Brandes ............... H05B 33/086 315/250 |
| 2014/0355274 A1 | 12/2014 | Santiago et al. |
| 2015/0131301 A1 | 5/2015 | Ho |
| 2015/0257211 A1 | 9/2015 | Johnson et al. |
| 2015/0282260 A1 | 10/2015 | Hussell et al. |
| 2016/0161098 A1 | 6/2016 | Tudorica et al. |

FOREIGN PATENT DOCUMENTS

| | | |
|---|---|---|
| CN | 104247061 A | 12/2014 |
| JP | H06291236 A | 10/1994 |
| JP | 2001 131517 A | 5/2001 |
| JP | 2010 199167 A | 9/2010 |
| JP | 2012 089551 A | 5/2012 |
| JP | 5459623 B2 | 4/2014 |
| KR | 10 0505838 | 10/2005 |
| KR | 20 2008 0002564 U | 7/2008 |
| KR | 20 2011 0008161 U | 8/2011 |

(56) References Cited

FOREIGN PATENT DOCUMENTS

| KR | 10 2011 0104336 | 9/2011 |
|---|---|---|
| WO | WO 2011/105409 | 9/2011 |
| WO | WO 2012/109225 A1 | 8/2012 |
| WO | WO 2013/148573 | 10/2013 |
| WO | WO 2014/093813 A1 | 6/2014 |
| WO | WO 2015/142537 A1 | 9/2015 |

OTHER PUBLICATIONS

"Technical Guide, Reflectance Materials and Coatings," Jan. 2012, pp. 1-26, Labsphere, USA.
"Thick-Film Ceramic Substrates Design Guide," Mar. 2012, pp. 1-16, CoorsTek, Colorado, USA.
International Search Report and Written Opininon for Application No. PCT/US2013/033704 dated Jun. 26, 2013.
Restriction Requirement for U.S. Appl. No. 13/436,247 dated Aug. 1, 2013.
Non-Final Office Action for U.S. Appl. No. 13/436,247 dated Nov. 7, 2013.
Abandoned U.S. Appl. No. 29/484,053, filed Mar. 5, 2014.
International Search Report and Written Opininon for Application No. PCT/US2013/074998 dated Apr. 3, 2014.
Restriction Requirement for U.S. Appl. No. 13/836,940 dated Jun. 17, 2014.
Notice of Allowance for U.S. Appl. No. 13/436,247 dated Jun. 18, 2014.
Non-Final Office Action for U.S. Appl. No. 13/836,709 dated Sep. 30, 2014.
Non-Final Office Action for U.S. Appl. No. 13/836,940 dated Oct. 7, 2014.
Restriction Requirement for U.S. Appl. No. 29/452,692 dated Dec. 4, 2014.
International Search Report for Application No. PCT/US2015/018964, dated Jan. 9, 2015.
Final Office Action for U.S. Appl. No. 13/836,709 dated Apr. 9, 2015.
Notice of Allowance for U.S. Appl. No. 29/452,692 dated Apr. 13, 2015.
Final Office Action for U.S. Appl. No. 13/836,940 dated Apr. 17, 2015.
Advisory Action for U.S. Appl. No. 13/836,709 dated Jun. 23, 2015.
Notice of Allowance for U.S. Appl. No. 29/452,692 dated Jul. 24, 2015.
Notice of Allowance for U.S. Appl. No. 29/452,692 dated Aug. 7, 2015.
Restriction Requirement for U.S. Appl. No. 14/639,743 dated Sep. 4, 2015.
Non-Final Office Action for U.S. Appl. No. 13/836,940 dated Sep. 11, 2015.
Restriction Requirement for U.S. Appl. No. 29/484,056 dated Nov. 10, 2015.
Non-Final Office Action for U.S. Appl. No. 13/836,709 dated Sep. 11, 2015.
Non-Final Office Action for U.S. Appl. No. 14/639,743 dated Dec. 31, 2015.
Restriction Requirement for U.S. Appl. No. 29/484,053 dated Jan. 15, 2016.
Final Office Action for U.S. Appl. No. 13/836,709 dated Feb. 12, 2016.
Final Office Action for U.S. Appl. No. 13/836,940 dated Feb. 12, 2016.
Chinese Office Action for Application No. 2013800183735 dated May 18, 2016.
Notice of Publication for U.S. Appl. No. 14/961,470 dated Jun. 9, 2016.
Non-Final Office Action for U.S. Appl. No. 13/836,709 dated Jul. 7, 2016.
Non-Final Office Action for U.S. Appl. No. 13/836,940 dated Jul. 21, 2016.
Non-Final Office Action for U.S. Appl. No. 14/221,839 dated Aug. 10, 2016.
Notice of Allowance for U.S. Appl. No. 14/639,743 dated Aug. 26, 2016.
Notice of Allowability for U.S. Appl. No. 14/639,743 dated Sep. 20, 2016.
Chinese Office Action for Chinese patent application No. 201380065403 dated Dec. 9, 2016.
Final Office Action for U.S. Appl. No. 13/836,709 dated Jan. 23, 2017.
Final Office Action for U.S. Appl. No. 13/836,940 dated Jan. 23, 2017.
Chinese Office Action for Chinese patent application No. 2013800183735 dated Jan. 18, 2017.
Restriction Requirement for U.S. Appl. No. 13/836,709 dated Jun. 19, 2014.
Notice of Allowance for U.S. Appl. No. 13/836,940 dated May 18, 2017.
Notice of Allowance for U.S. Appl. No. 13/836,709 dated Jun. 29, 2017.

\* cited by examiner

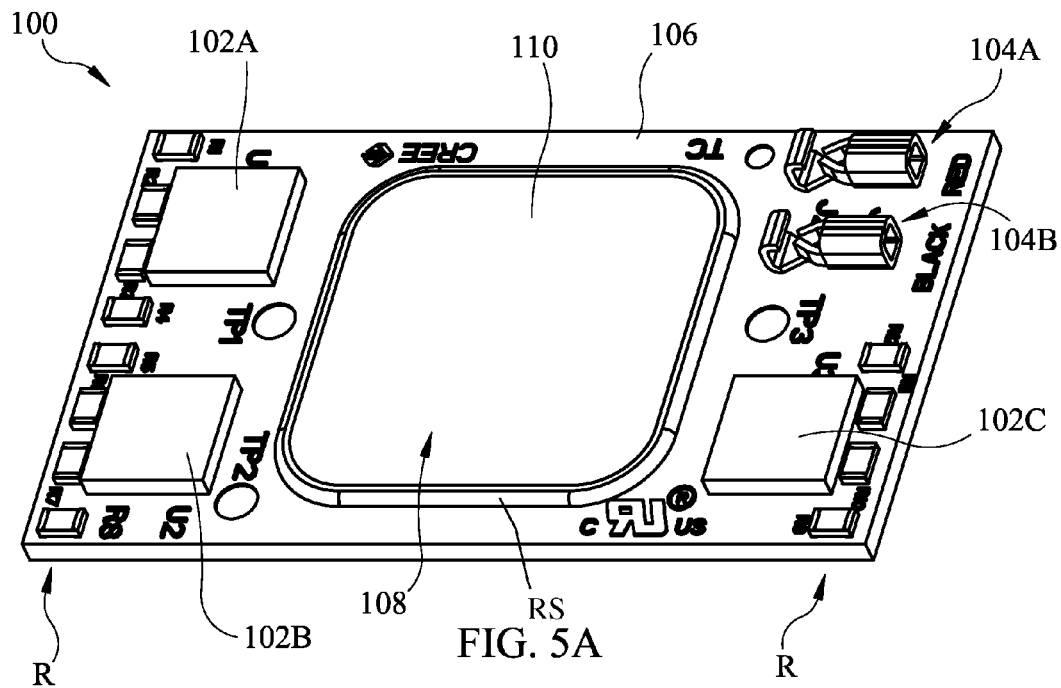
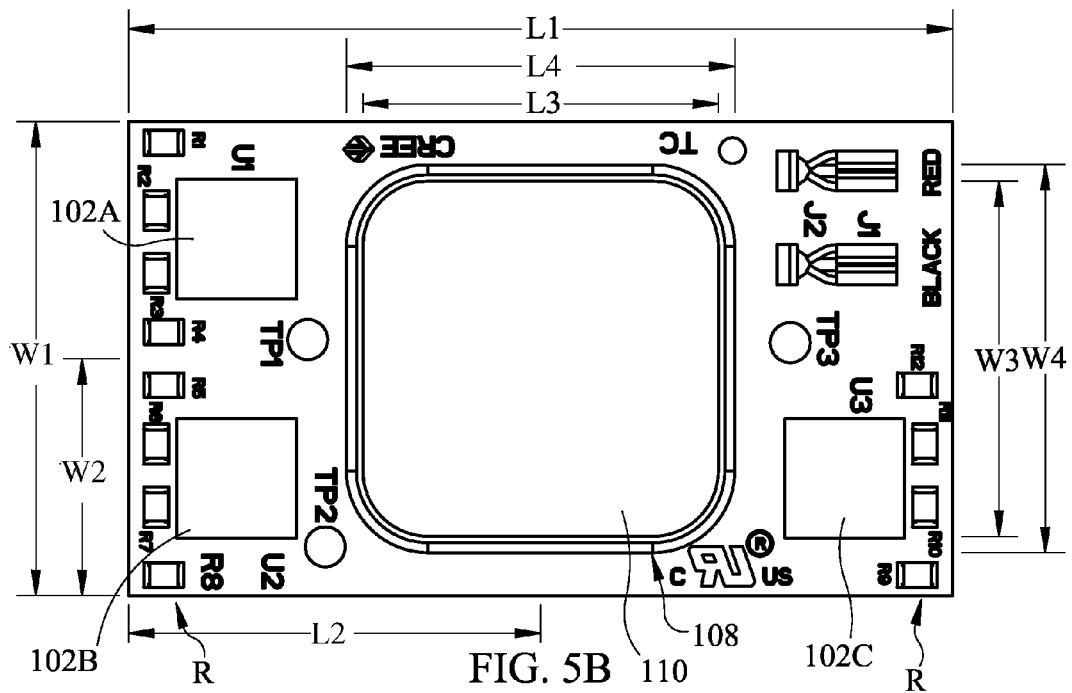

VOLTAGE CONFIGURABLE SOLID STATE LIGHTING APPARATUSES, SYSTEMS, AND RELATED METHODS

CROSS REFERENCE TO RELATED APPLICATIONS

This application claims priority to U.S. Provisional Patent Application Ser. No. 62/088,375 dated Dec. 5, 2014, and also to U.S. Provisional Patent Application Ser. No. 62/108,425 dated Jan. 27, 2015, the disclosures of which are incorporated herein by reference.

TECHNICAL FIELD

The present subject matter generally relates to lighting apparatuses, systems, and related methods and, more particularly, to voltage configurable solid state lighting apparatuses and related methods.

BACKGROUND

Solid state lighting emitters are used in a variety of lighting apparatuses in, for example, commercial, industrial, automotive, and consumer lighting applications. Solid state emitters can comprise, for example, one or more unpackaged light emitting diode (LED) chips, one or more packaged LED chips, wherein the chips can comprise inorganic and/or organic LED chips (OLEDs).

Solid state emitters generate light through the recombination of electronic carriers (electrons and holes) in a light emitting layer or region of an LED chip. LED chips have significantly longer lifetimes and a greater luminous efficiency than conventional incandescent and fluorescent light sources. However, as LED chips are narrow-bandwidth light emitters, it can be challenging to simultaneously provide good color rendering in combination with high luminous efficacy while maintain a maximizing brightness and efficiency.

Incandescent bulbs tend to produce a natural and aesthetically pleasing illumination compared to other types of conventional lighting apparatuses. In particular, incandescent bulbs typically range from a color temperature of about 2700K at full brightness, a color temperature of about 2000K at 5% brightness, and a color temperature of about 1800K at about 1% brightness. This compares favorably with daylight, which varies from about 6500K at midday to about 2500K at sunrise and sunset.

Research indicates that people tend to prefer warmer color temperatures (e.g., approximately 2700K to 3000K) at low brightness levels in intimate settings. LED lighting manufacturers are challenged with providing lighting sources or apparatuses utilizing LED chips to generate light having a color behavior that approximates the behavior of incandescent lighting. Another challenge exists in achieving dimmable color behavior via LED chip based lighting apparatuses that approximate the dimmable characteristics of incandescent lighting.

Conventional lighting systems can be powered via an alternating current (AC) source, however, they typically require a costly AC-DC power converter. Challenges exist in providing LED chip based light sources that are operable directly from an AC power source with imperceptible flicker and/or adequate thermal management. Even further challenges exist in providing drop-in devices that are voltage configurable (e.g., operable at multiple voltage selections and/or "user-selectable" voltages) for use in multiple different lighting applications.

Accordingly, a need exists for improved solid state lighting apparatuses, systems, and/or improved methods that can be directly coupled to an AC voltage signal without requiring use of an on-board switched mode power supply, and which are operable and/or configurable at multiple different voltages. Desirable solid state lighting apparatuses, systems, and methods can exhibit improved light extraction, brightness, and/or improved thermal management. Desirable apparatuses, systems, and/or methods exhibit reduced cost, reduced perceptible flicker, and make it easier for end-users to justify switching to LED products from a return on investment (ROI) or payback perspective.

SUMMARY

Solid state lighting apparatuses adapted to operate with alternating current (AC) received directly from an AC power source and related methods are disclosed. In some aspects, solid state lighting apparatuses, systems, and methods are voltage configurable. Solid state lighting apparatuses, systems, and related methods are described. A solid state lighting apparatus can comprise an array of solid state light emitters arranged on or over the substrate and a plurality of driving components arranged on or over the substrate. The driving components are independent (e.g., mutually exclusive) and configured to activate and deactivate at least some of the solid state light emitters of the array of solid state light emitters during a portion of an alternating current (AC) cycle.

A method of providing a solid state lighting apparatus can comprise providing a substrate, mounting an array of solid state light emitters on or over the substrate, and providing a plurality of independent driving components on or over the substrate. Different drivers can independently supply current to different sets, segments, and/or strings of solid state light emitters.

A solid state lighting system includes a solid state lighting apparatus having an array of solid state light emitters, a plurality of independent driving components, and a rectifying circuit for rectifying current supplied to the driving components.

Other aspects, features and embodiments of the subject matter will be more fully apparent from the ensuing disclosure and appended claims. Apparatuses, systems, and methods provided herein comprise improved dimming capabilities, improved thermal management capabilities, improved brightness, reduced perceptible flicker, and/or being voltage configurable for accommodating/serving multiple different lighting applications. These and other objects can be achieved according to the subject matter herein.

BRIEF DESCRIPTION OF DRAWINGS

A full and enabling disclosure of the present subject matter is set forth more particularly in the remainder of the specification, including reference to the accompanying figures, relating to one or more embodiments, in which:

FIGS. 5A to 5E are various views illustrating a solid state lighting apparatus including multiple solid state light emitters and associated circuitry, on or over a substrate according to some aspects;

DETAILED DESCRIPTION

Figure 1A:
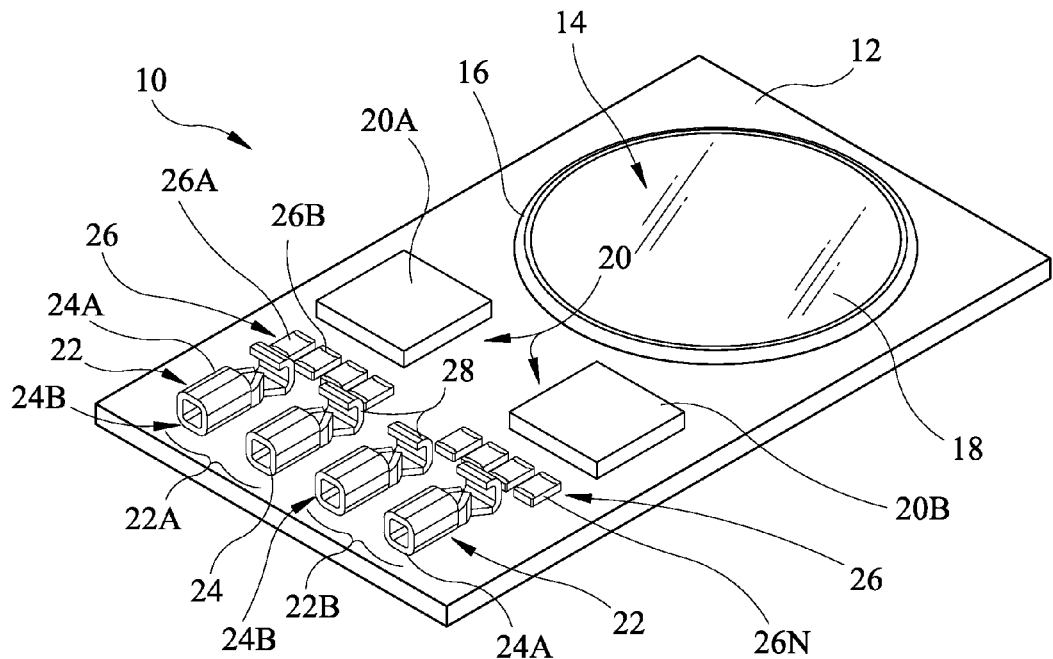
FIGS. 1A to 1E are various views illustrating a solid state lighting apparatus including multiple solid state light emitters and associated circuitry, on or over a substrate according to some aspects.

The present subject matter relates in certain aspects to solid state lighting apparatuses, systems, and methods that are adapted to operate with alternating current (AC) received directly from an AC power source and related methods. Apparatuses, systems, and methods herein are voltage configurable, thereby having improved operability for a wide range of lighting applications.

Exemplary solid state lighting apparatuses, systems, and/or methods are voltage configurable and comprise multiple-drivers (e.g., LED drivers or drive circuitry, drive components), not limited to multiple power chips. Apparatuses, systems, and/or methods described herein can comprise two or more rectified-AC drivers configured in series or in parallel. Exemplary solid state lighting apparatuses, systems, and/or methods herein comprise a single component operable at higher power while also allowing for voltage selection. That is, apparatuses, systems, and/or methods herein comprise multi-tap drivers allowing for line voltage selection between approximately 90 VAC and 300 VAC. In some aspects, apparatuses, systems, and/or methods herein comprise multiple drivers allowing for operability of a single lighting component at approximately 120 VAC and approximately 240 VAC.

Exemplary solid state lighting apparatuses can comprise a substrate, multiple sets, segments, or strings of a plurality of serially connected solid state light emitters arranged on or supported by the substrate, and multiple current driving components (e.g., drive circuitry or power chips) arranged on or supported by the substrate. At least first and second sets of the multiple sets of solid state light emitters are configured to be activated and/or deactivated at different times relevant to one another during a portion of an AC cycle via the driving components for providing improved dimming having reduced and/or imperceptible flicker.

Driving components, such as power chips with multi-tap drivers, can be configured directly or indirectly in series and/or in parallel via one or more bridge rectifiers. In some aspects, multiple bridge rectifiers are used to directly or indirectly configure multiple drivers disposed over one component. Voltage configurable apparatuses, systems, and/or methods are configured to deliver electrical current via the multiple drivers to the one or more sets of solid state light emitters via drive components. In some aspects, electrical current is delivered to solid state emitters via one driver, in other aspects, electrical current is delivered via multiple different drivers. Configuring multiple different drivers in series or parallel can allow for and/or provide voltage configurable components. As the multiple drivers can separately drive different sets/segments of serially connected LED chips, flicker may also improve (e.g., where driven at different phases of an AC waveform).

Apparatuses, systems, and related methods herein provide drop-in devices for operability at multiple and user-selectable voltages. In some aspects, a 4-wire selection is reduced to a three for simplified wiring schemes. Apparatuses, systems, and methods disclosed herein allow for lower power consumption thereby reducing heat and improving thermal dissipation therein. Apparatuses, systems, and methods herein utilize ceramic based substrates for improving heat dissipation and minimizing inter-board connections. Apparatuses, systems, and methods herein provide at least approximately 4 kilolumens (klm) or more, at least approximately 5 klm or more, or at least approximately 6 klm or more. Apparatuses, systems, and methods herein are operable to deliver at least approximately 4 klm or more with surge protection.

In some aspects, solid state lighting apparatuses and systems described herein can comprise various emitter configurations, color combinations, and/or circuit components adapted to reduce perceivable flicker, perceptible color shifts, and/or perceptible spatial variations in luminous flux that could potentially occur during activation and/or deactivation of multiple sets of different solid state light emitters.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It is understood that when an element such as a layer, region, or structure is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter" and "emitter" as used herein refer to any device capable of producing visible or near visible (e.g., from infrared to ultraviolet) wavelength radiation, including but not limited to, xenon lamps, mercury lamps, sodium lamps, incandescent lamps, and solid state emitters, including light emitting diodes (LEDs or LED chips), organic light emitting diodes (OLEDs), and lasers.

The terms "solid state light emitter" or "solid state emitter" refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LED chips are electrically connected in series, in parallel, or in mixed series/parallel configurations among mutually exclusive groups/segments/sets.

The LED "segment" further refers to a separately switched portion of a string of LED chips. A segment can include at least one LED chip, which can itself include a number of serially connected epi junctions used to provide a chip that has a particular forward voltage, such as 3V, 6V, 9V, etc. where a single epi junction may have a forward voltage of about 1.5V to 2.7V (e.g., for blue LED chips) or typically 3V at normal current. Each segment can also comprise multiple LED chips that are connected in various parallel and/or serial arrangements. The segments of LED chips can be configured in a number of different ways and may have various compensation circuits associated therewith, as discussed, for example, in commonly assigned and co-pending U.S. patent application Ser. No. 13/235,103 and U.S. patent application Ser. No. 13/235,127, the disclosure of each of which is hereby incorporated by reference herein.

The terms "driver", "LED driver", "drive circuitry", and "power chip" are synonymous and refer to integrated circuit (IC) components or elements adapted to deliver current to LED chips for causing illumination thereof. In some aspects, LED drivers or power chips described herein comprise components available from Supertex, Inc. of Sunnyvale, Calif., which was recently acquired by Microchip Tech.

The term "targeted" refers to configurations of LED chip segments that are configured to provide a pre-defined lighting characteristic that is a specified parameter for the lighting apparatus. For example, a targeted spectral power distribution can be a spectral power distribution that is specified for the light provided by the apparatus as a result of dimming the light. In particular, the targeted spectral power distribution can describe the characteristic of the light that is generated at a particular dimming level. In some aspects, the targeted spectral power distribution can be specified on the packaging of the lighting apparatus or otherwise in conjunction with the advertising or marketing of the lighting apparatus. Furthermore, the targeted spectral power distribution can be associated with the lighting characteristics of two or more specified dimming levels, such as a low light level and a higher light level. Accordingly, the targeted spectral power distribution can be provided as the light shifts from "full on" to more dimming as well a shift in the reverse direction toward "full on".

Apparatuses and segments can comprise multiple LED segments, each configured to emit a different CCT color temperature for improved dimming. Each LED chip within each respective segment can target approximately a same CCT value. For example, and in some aspects, a first segment can be configured to emit light comprising a CCT value targeting approximately 1800K, at least one other segment can be configured to emit slightly cooler light, for example, comprising CCT values targeting approximately 2100K and 2400K, respectively, and at least one other segment can emit slightly cooler light targeting approximately 3000K. When each segment is powered "on", together the segments are collectively configured to emit warm white light that is tuned or targeted to approximately 2700K and/or approximately 3000K. As each segment turns from "on" to "off", light warms from approximately 2700K (e.g., or 3000K) to 1800K as it dims, incandescent-style. Thus, apparatuses and systems herein are configured to emit light that is pleasing to consumers. For example, in some aspects according to the present subject matter, the dimming may be provided using the techniques described in the priority document noted above, U.S. patent application Ser. No. 14/221,839, filed on Mar. 21, 2014, the disclosure of which is incorporated herein by reference in the entirety.

LED chips can be characterized as having a particular spectral power distribution, which can affect various light characteristics of the light emitted by the chip. A spectral power distribution can be used to express the power per unit area per unit wavelength of an illumination (radiant exitance), or more generally, the per wavelength contribution to any radiometric quantity (such as radiant energy, radiant flux, radiant intensity, radiance, irradiance, radiant exitance, and/or radiosity, etc.). A spectral power distribution can be normalized in some aspects, such as, to unity at 555 or 560 nanometers (nm), coinciding with the peak of the eye's luminosity function.

The term "substrate" as used herein in connection with lighting apparatuses refers to a mounting member or element on which, in which, or over which, multiple solid state light emitters (e.g., LED chips) and/or circuitry components can be arranged, supported, and/or mounted. Exemplary substrates useful with lighting apparatuses as described herein comprise printed circuit boards (including but not limited to metal core printed circuit boards, flexible circuit boards, dielectric laminates, ceramic based substrates, and the like) or ceramic boards having FR4 and/or electrical traces arranged on one or multiple surfaces thereof, support panels, and/or mounting elements of various materials and conformations arranged to receive, support, and/or conduct electrical power to solid state emitters. Electrical traces described herein can be visible and/or covered via a reflective covering, such as a solder mask.

In some aspects, a single, unitary substrate can be used to support multiple groups of solid state light emitters in addition to at least some other circuits and/or circuit elements, such as a power or current driving components. In other aspects, multiple substrates can be used for supporting and/or electrically connecting to the solid state light emitters and power components.

Solid state lighting apparatuses according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip"

orientation. Such LED and/or laser chips can also be devoid of growth substrates (e.g., following growth substrate removal).

LED chips useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit one or more beams to stimulate emissions of one or more lumiphoric materials (e.g., phosphors, scintillators, lumiphoric inks, quantum dots) to generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LED chips having a planarized coating of phosphor integrated therewith are discussed by way of example in U.S. Patent Application Publication No. 2008/0179611 to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LED chips of different colors, one or more of which can be white emitting (e.g., including at least one LED chip with one or more lumiphoric materials).

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175 and U.S. Patent Application Publication No. 2009/0184616), are well-known and available to persons of skill in the art.

Dimming effects, where the CCT of the light source changes when dimmed, can be achieved by mixing red/orange (RDO), amber, blue shifted yellow (BSY), warm white, and other LED chips or die that produce different colors in a direct drive configuration are provided. In a dim to warm example, LED chips combine to produce a desired end CCT point will be used and connected to a direct drive controller, such as a power chip. In low dimming instances, one string will be the only string active in a direct drive topology. As the other strings turn on, cooler LED chips are used to increase the color temperature. This change in CCT will behave in the opposite manner as the dimming level is decreased. Mixing different color LED chips in different targeted strings will allow for color change while dimming and increase the CCT of the LED source. Aspects of color mixing, segmental switching "on" and "off" during an AC waveform, and dimming according to the present subject matter may be provided using the circuitry and/or techniques described in U.S. patent application Ser. No. 14/221,839, the disclosure of which was previously incorporated hereinabove by reference.

The expression "lighting apparatus" as used herein, is not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, or any other light emitting device.

In some aspects, lighting apparatuses and systems as described herein are devoid of any AC-to-DC converter in electrical communication between the AC power source and multiple sets (e.g., disposed in an array) of solid state light emitters. In some aspects, lighting apparatuses and systems as described herein comprises multiple power circuits (e.g., a packaged driving circuit or driving component) for providing voltage configurable components. The at least one power circuit can comprise a current switching circuitry that is packaged or housed within a housing and arranged in electrical communication between an AC power source and multiple sets of solid state light emitters. In some aspects, lighting apparatuses and systems as described herein comprise at least one rectifier bridge (or multiple rectifier bridges in some aspects) arranged in electrical communication between the AC source and multiple sets of solid state light emitters for rectifying the AC signal.

In some aspects, lighting apparatuses and systems as described herein comprise multiple sets of mutually exclusive solid state light emitters that are configured to be activated and/or deactivated at different times relative to one another during a portion of an AC cycle, and each set of the multiple sets comprises at least a first solid state light emitter segment targeting a first color and at least a second solid state light emitter segment targeting a second color that is different than the first color. In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selective activating sets of solid state emitters is according to the present subject matter may be provided using the circuitry and/or techniques described in U.S. patent application Ser. No. 14/221,839, the disclosure of which was previously incorporated hereinabove by reference.

In some aspects, lighting apparatuses as described herein comprise multiple sets of solid state light emitters that are configured to be activated and/or deactivated at different times relative to one another during a portion of an AC cycle, and the lighting apparatus comprises an output of at least approximately 100 lumens per watt (LPW) or more, at least about 120 LPW or more, at least approximately 130 LPW or more, at least approximately 140 LPW or more, or more than approximately 150 LPW. One or more of the foregoing LPW thresholds are attained for emissions having at least one of a cool white (CW) color temperature or a warm white (WW) color temperature. White emissions of apparatuses and/or systems herein have x, y color coordinates within four, seven, or ten MacAdam step ellipses of a reference point on the blackbody locus of a 1931 CIE Chromaticity Diagram. Apparatuses and systems described herein can be powered via approximately 10 watts (W) or more.

In some aspects, lighting apparatuses and systems described herein can emit white light having a reference point on the blackbody locus (e.g., 1931 CIE Chromaticity Diagram) can have a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from a lighting apparatus as described herein embody a color rendering index (CRI Ra) value of at least 70, at least 75, or at least 80 (e.g., 82 or 85) or more.

Various illustrative features are described below in connection with the accompanying figures.

Figure 1B:
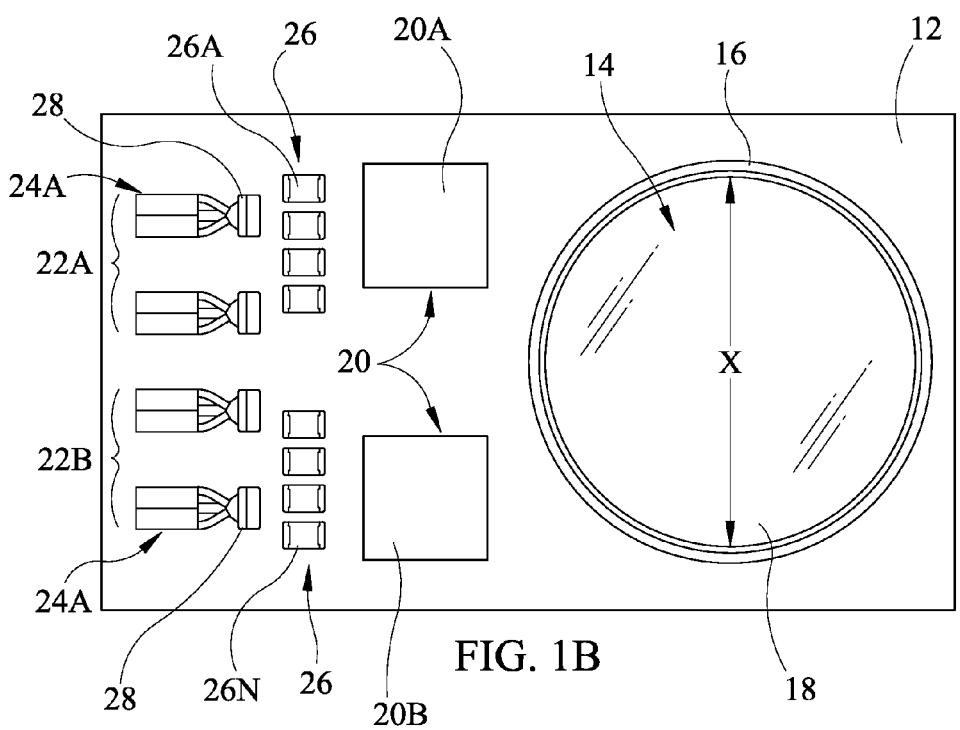
Figure 1C:
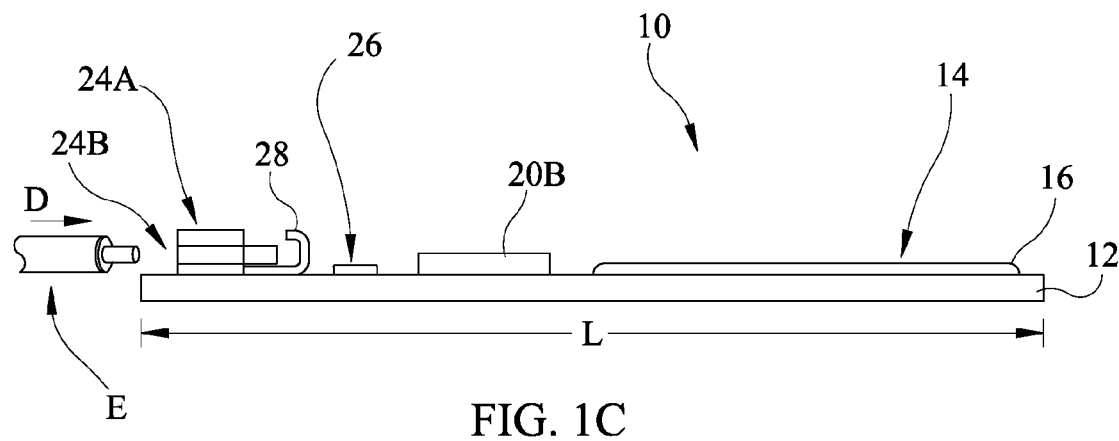
Figure 1D:
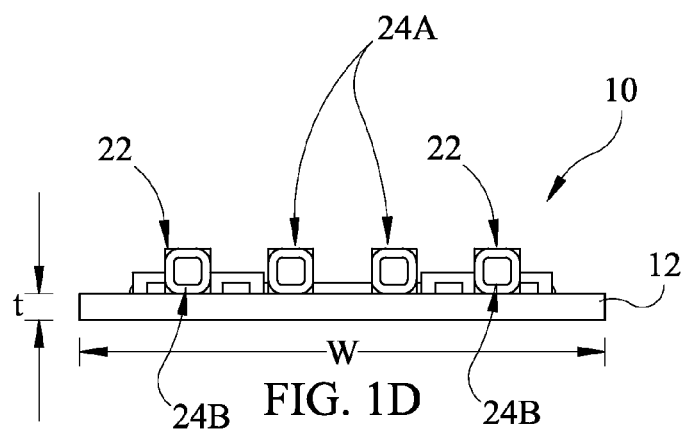
Figure 1E:
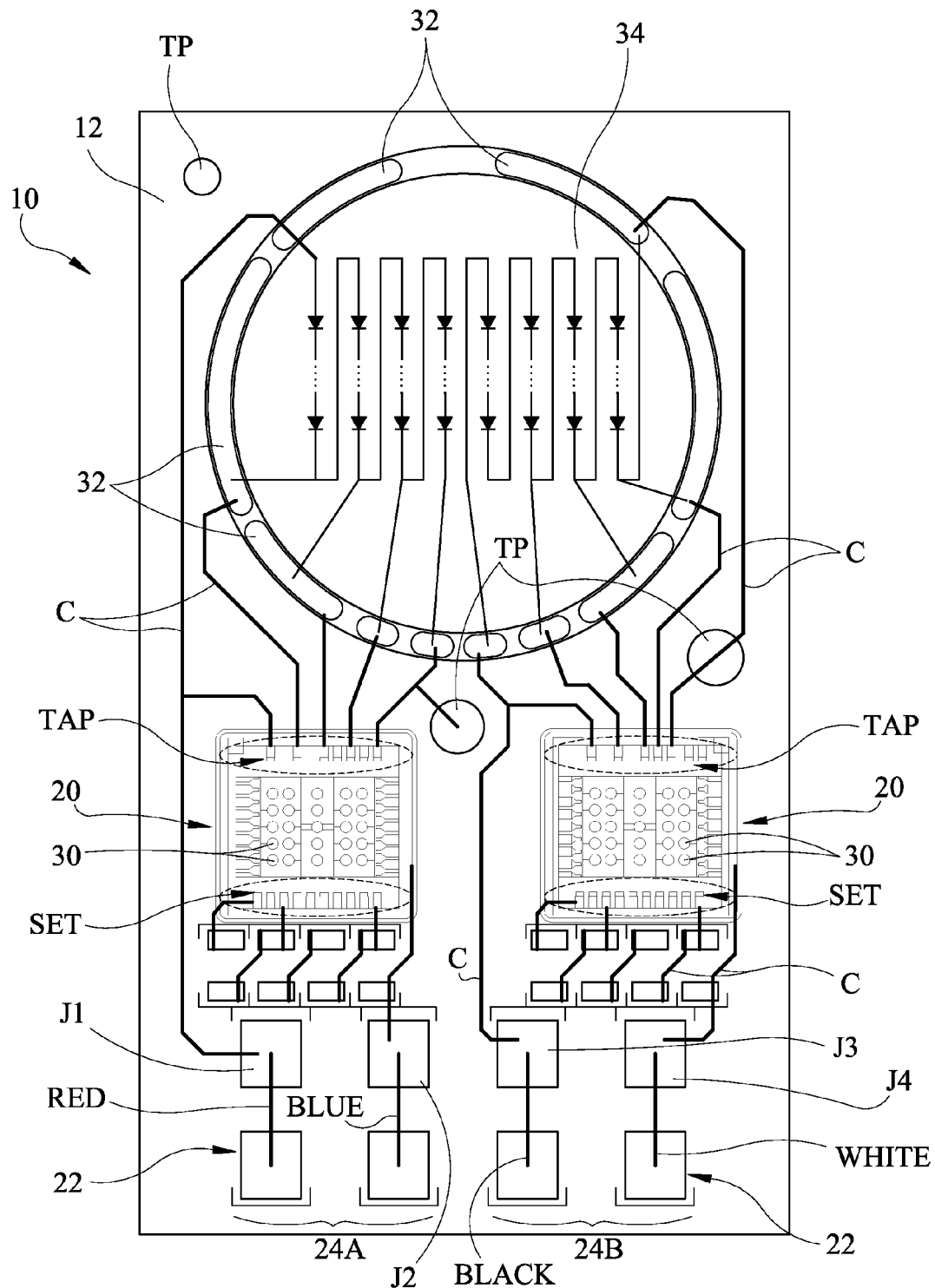

FIGS. 1A to 1E illustrate various views of a solid state lighting apparatus, generally designated 10. Apparatus 10 can comprise a substantially rectangular substrate 12 over which a substantially circular light emission area, generally designated 14 is provided. Light emission area 14 can comprise a substantially circular light emitter surface, for example, as described, in commonly assigned and co-pending U.S. Pat. No. 8,564,000, U.S. Pat. No. 8,624,271, and U.S. patent application Ser. No. 13/282,172, the disclosure of each of which is hereby incorporated by reference herein. As illustrated by FIGS. 1A to 1D, apparatus 10 can comprise a retaining structure or retention member 16 disposed about light emission area 14 for retaining portions of a filling material 18. FIG. 1E supplements FIGS. 1A to 1D by illustrating the electrical connectivity of various components (e.g., strings of LED chips) of and/or within apparatus 10. As such, FIG. 1E shows apparatus 10 without retention member 16 and/or filling material 18 for clarification and/or illustration purposes.

Referring generally to FIGS. 1A to 1E, apparatus 10 can comprise substrate 12 over which a light emission area generally designated 14, is provided and supported. Substrate 12 can comprise a PCB that may not fully extend below the light emission area, in some aspects. Emission area 14 can comprises one or more LED chips (not shown, see e.g., 56 FIG. 2B) disposed within and/or below filling material 18. LED chips (56, FIG. 2B) can be provided in one or more mutually exclusive and/or separately switchable LED strings, sets, or segments and/or in one or more patterns. Apparatus 10 can comprise any number of LED chips (56, FIG. 2B) and/or strings of LED chips.

In some aspects, apparatus 10 comprise multiple independent (e.g., independently wired or connected) LED drivers, power/drive circuitry, and/or drive components, generally designated 20 for independently activating different and independent sets of light emitters. Drive components 20 are configured to pass electrical current into one or more LED chips (56, FIG. 2B) of light emission area 14. Apparatus 10 can comprise multiple components 20 thereby allowing apparatus 10 to be voltage configurable, and adaptable to user-defined voltages. That is, the multiple drive components 20 render apparatus 10 operable at approximately 90 VAC or more; approximately 120 VAC or more; or approximately 240 VAC or more. Components 20 can be selectively configured for operability at multiple different voltages. In some aspects, multiple components 20 are serially connected. In other aspects, multiple components 20 are electrically connected in parallel. Any electrical configuration of components 20 over substrate can be provided.

In some aspects, each driving component 20 in apparatus 10 is configured to activate/deactivate one independent set of light emitters targeting a specific color temperature. In further aspects, each driving component 20 in apparatus 10 is configured to independently activate/deactivate a plurality of sets of light emitters, where each set targets a specific color temperature.

In some aspects, substrate 12 is configured to support multiple LED chips (e.g., 56, FIG. 2B) disposed in light emission areas 14 as well as multiple different electrical components and/or circuitry. For example, one or more direct drive controllers and/or drive circuitry or components 20 can be mounted on and/or supported by substrate 12. In some aspects, at least two drive components 20, designated 20A and 20B, can be mounted on and/or disposed over substrate 12 about light emission area 14. Components 20A and 20B can control an amount of current that is transferred and/or pushed into LED chips (56, FIG. 2B) of emission area 14 via set and tap lines (see e.g., "SET" and "TAP" lines, FIG. 1E).

The term "on" as used, for example, in "arranged on" or "mounted on" herein comprises configurations where the component, such as an LED chip or submount of an LED package, can be physically and/or electrically connected to a portion of substrate 12 via solder, epoxy, silicone, adhesive, glue, paste, combinations thereof and/or any other suitable attachment material and/or method. Various components or elements are described as being "mounted on" substrate 12 and can be disposed on the same surface of the same substrate 12, on opposing surfaces of the same substrate 12, or on adjacent surfaces of the same substrate 12. For example, components that are placed and soldered on the same substrate during assembly can be described as being "mounted on" that substrate.

Drive components 20 can be disposed on a same side or surface of substrate 12 or on different sides or surfaces of substrate 12, in some aspects depending upon the size and/or amount of space available over substrate 12. Emission area 14 can be off-centered or non-centrally disposed over substrate 12, or emission area 14 can be centrally disposed over substrate 12 (e.g., FIG. 2A). Any size, shape, placement, and/or orientation of components 20 and emission area 14 are contemplated. In some aspects, drive components 20 comprise power chips or packaged IC.

In some aspects, each drive component 20 comprises a "smart" chip meaning that it is adapted to monitor AC line voltage and selectively switch current to power on/off one or more LED chips (e.g., 56, FIG. 2B) and/or strings thereof based upon the magnitude of the rectified AC voltage signal carried via an electrical wire, generally designated E, in FIG. 1C.

Drive components 20 can comprise a packaged IC component, a current switching circuitry, and/or a current switching element adapted to switch current to, from and/or between one more LED chips (56, FIG. 2B) for controlling a light output and/or color emitted from apparatus 10. For example and during dimming, drive components 20 can segmentally bypass and/or selectively route power to LED chips (56, FIG. 2B) and/or strings of LED chips so that light emitted by apparatus 10 may more closely approximate incandescent lighting. In some aspects, apparatus 10 emits a dimmed light having a CCT value of about 1800K or a CX and CY of about (0.55, 0.41).

Substrate 12 can also support one or more electrical receivers or connectors, generally designated 22, which are attached or mounted thereto and/or disposed thereon. In some aspects, multiple pairs of connectors 22 are provided per apparatus 10, such as, for example, at least a first pair 22A and a second pair 22B of connectors. Each set or pair of connectors 22A and 22B comprises a pair of positive and negative electrical terminals configured to communicate rectified AC electrical signal to electrical components and LED chips (56, FIG. 2B) disposed over substrate 12. For example, connectors 22A and 22B can pass electrical current to one or more LED chips (e.g., FIG. 2B); drive components 20, and/or any other circuitry that may be disposed over substrate 12. Electrical signal can pass into and out of apparatus 10 via connectors 22. In some aspects, electrical signals passes between connectors 22 and other electrical components of apparatus 10 via internally disposed and/or externally disposed electrical traces, pads, or other signal carriers (e.g., "C", FIG. 1E).

In some aspect, connectors 22 can comprise an outer portion 24A and a connector input or receiving portion, generally 24B. Outer portion 24A and inner portion 24B can comprise a same material (e.g., metal) and be integrally formed in some aspects. As FIG. 1C illustrates, an electrical wire E carrying rectified AC current can be directly received within and/or fixedly held to apparatus 10 via connector 22. Connectors 22 can electrically and/or physically connect to one or more terminals of apparatus 10, such that electrical signal or current from electrical wire E passes into terminals via the physical and electrical connection. In some aspects, at least a portion of outer portion 24A is electrically conductive, for passing current directly from electrical wire E into substrate terminals (e.g., electrically conductive portions). Receiving portions 24B can comprise one or more openings in which input electrical wires E carrying AC power can be received and directly connected with apparatus 10. As FIG. 1C further illustrates, one or more electrical wires E from a rectified AC power source can directly connect with apparatus 10 upon insertion of wire E, for example, in a direction D within receiving portion 24B.

Referring in general to FIGS. 1A to 1E and in some aspects, an amount of current passing into, between, and/or through electrical components of apparatus 10 can be guided, tuned, and/or controlled using one or more resistors, generally designated 26. At least a first resistor 26A is disposed over substrate 12, however, any number of individual resistors 26N, where "N" is a whole number integer, can be disposed over substrate 12 and physically and/or electrically connected thereto. In some aspects, substrate 12 comprises a circuit carrying structure, such as a PCB, a MCPCB, a laminate structure, FR4, flex circuitry, etc. Optional rectifying circuitry, electrostatic discharge (ESD) protection components, and/or surge protection circuitry can also be supported by substrate 12, where desired. Electrical wire E (FIG. 1C) being received and physically/electrically connected to connectors 22 can be pushed into or through connector 22 until it abuts a stop portion 28. A plurality of electrical terminals (e.g., J1 to J4, FIG. 1E) electrically and/or physically connect with stop portions 28, so that electrical current carried via electrical wires E passes directly into terminals J1 to J4 of substrate 12 and/or into components (e.g., LED chips, resistors, drive components, etc.) electrically linked or connected thereto.

Substrate 12 can comprise any suitable circuit carrier and/or circuit carrying structure not limited to a ceramic based substrate, for example, alumina (Al$_2$O$_3$), high reflectivity alumina, or any other suitable ceramic or ceramic based material. In other aspects, substrate 12 comprises multiple layers of material, where at least one layer is a ceramic or a dielectric base layer. Substrate 12 can comprise any suitable material, such as ceramic, Al, an Al based material such as MIRO available from Alanod (e.g., Al and Ag), etc., having one or more layers, such as traces provide thereon. In some aspects, substrate 12 comprises a PCB, a MCPCB, a laminate structure having one or more layers connected via adhesive, a flexible printed circuit board ("flextape" PCB) comprising a polymer-like film having at least one conductive layer within one or more layers of a flexible plastic resin (e.g., polyimide, Kapton from DuPont), and one or more adhesive layers comprising a pressure sensitive adhesive (PSA) provided on the flextape for easy connection to a ceramic body.

In some aspects, substrate 12 can comprise a ceramic base having one or more (e.g., and optionally flexible) layers adhered thereon as discussed, for example, in commonly assigned and co-pending U.S. patent application Ser. No. 13/836,709 and U.S. patent application Ser. No. 13/836,940, the disclosure of each of which is hereby incorporated by reference herein.

The layout or design of apparatus 10 can vary and/or become selectively changed for maximizing space over substrate 12. Maximizing space can allow lighting designers to increase or decrease a size or diameter X (FIG. 1B) of emission area 14, for changing optical properties, such as brightness. In some aspects, substrate 12 can be provided in any relatively compact form factor (e.g., square, rectangle, circular, non-square, non-circular, symmetrical and/or asymmetrical) for supporting one or more LED segments (e.g., FIG. 2B) thereon.

Referring to FIG. 1B, light emission area 14 can comprise a light emitter surface having a diameter X of approximately 5 mm or more; approximately 10 mm or more; approximately 12 mm or more; approximately 14 mm or more; approximately 25 mm or more; approximately 30 mm or more; approximately 40 mm or more; approximately 50 mm or more; and/or a diameter X having any range between approximately 5 and 100 mm.

Referring to FIGS. 1C and 1D and in some aspects, substrate 12 can comprise a rectangle of a width W and a length L of approximately 20 mm×40 mm, such as approximately 23.75 mm×41.25 mm. In some aspects, apparatus 10 comprises a light emitter surface X of approximately 18 mm in diameter as provided over an approximately 24 mm×41 mm rectangular board or substrate 12. Any size and/or shape of substrate 12 can be provided.

For example and in one aspect, apparatus 10 can be operable at an input voltage (e.g., AC line voltage) or a rectified AC voltage of approximately 120 VAC. In other aspects, apparatus 10 can be operable at a rectified AC voltage of approximately 240 VAC. Electrical current can pass directly into apparatus 10 from electrical wires E and then into LED chips (FIG. 2B) via components 20. Any voltage or current can be delivered to LED chips via components 20 that are either serially connected or connected in parallel. In some aspects, apparatus 10 can comprise sensor or comparator circuitry for monitoring the line voltage and determining when to switch LED segments (FIG. 2B) on/off at different times, for improved efficiency and less perceptible flicker.

Two or more LED segments (i.e., serially connected LED chips) can be provided per apparatus, where each LED chip or segment (FIG. 2B) is operable at approximately 30 V or more. For example, where a user requires a 120 V drop-in apparatus, at least three strings of LED chips may be provided where each string is operable at approximately 40V or more, thereby below a peak voltage of approximately 170V. The driver(s) take up excess voltage. In other aspects, four strings of LED chips may be provided, where each string is operable at approximately 30V, thereby below a peak voltage of about 170V (e.g., so that each string is operable to a sum of about 120V) where the driver(s) takes up the excess voltage. In other aspects, where a user requires a 240 V apparatus, at least six strings of LED chips may be provided where each string is operable at approximately 40V or more, thereby equaling a line voltage of approximately 240 V. Any number of LED chips (56, FIG. 2B) and/or segments can be provided per apparatus 10, where each segment is comprised of any number of serially connected LED chips.

FIG. 1D illustrates a side view of apparatus 10, over which both a light emission area (e.g., 14) and electrical components are provided. Substrate 12 can comprise any suitable thickness t. For example, thickness t can be approximately 0.2 mm or more, approximately 0.5 mm or more, or approximately 1 mm or more. In some aspects, substrate 12 comprises a layer of ceramic (e.g., AlN, $Al_2O_3$, etc.) and one or more layers of trace metal disposed thereon. Traces (32, FIG. 1E) can comprise one or more layers of copper (Cu), titanium (Ti), silver (Ag), tin (Sn), and/or ENIPEG (e.g., nickel (Ni), palladium (Pd) and gold (Au). In some aspects, substrate 12 also comprises a layer of non-metallic material, such as an adhesive layer and/or a solder mask material disposed over the traces.

FIG. 1E is a view of apparatus 10 without retention material 16, filling material 18, and/or a layer of solder mask such that electrical connectors and/or electrical traces are visible. FIG. 1E is illustrative of various electrical components, traces, circuitry, connectors, and drive components 20 prior to masking or otherwise covering traces with electrically insulating and/or reflective coverings (e.g., solder mask). Thus, some features shown in FIG. 1E may not be visible during use and/or operation of apparatus 10 (see e.g., FIG. 1A in which some traces, LED chips, and/or electrical connections between components and circuitry may not be visible in a final, fully manufactured form).

As FIG. 1E illustrates, one or more through holes or "vias" 30 can be provided within substrate 12 below portions of each drive component 20 for improving thermal management and improved heat dissipation of drive components 20 through substrate 12. Improved thermal management also allows apparatus 10 to run cooler, thereby providing more reliable and efficient operation.

Substrate 12 can further comprise one or more electrically conductive layers, also known as traces 32, for passing electrical current between electrically conductive components disposed thereon. Traces 32 can be disposed about a mounting pad or area 34 over which one or more LED chips (e.g., 56, FIG. 2B) can be attached, mounted and/or supported. Other circuitry, such as electrically conductive signal carriers C (e.g., traces) can also be disposed over and/or internally with substrate 12 for passing electrical signal therethrough. In some aspects, carriers C pass electrical signal to traces 32 and into LED chips (56, FIG. 2B) connected thereto for directly driving the chips. In some aspects, substrate 12 comprises a circuit board and carriers C comprise electrically conductive traces, wires, wirebonds, and/or any other electrically conductive components or circuitry thereof. Carriers C can pass electrical current from drive components 20 into LED chips (e.g., 56, FIG. 2B).

Figure 2A:
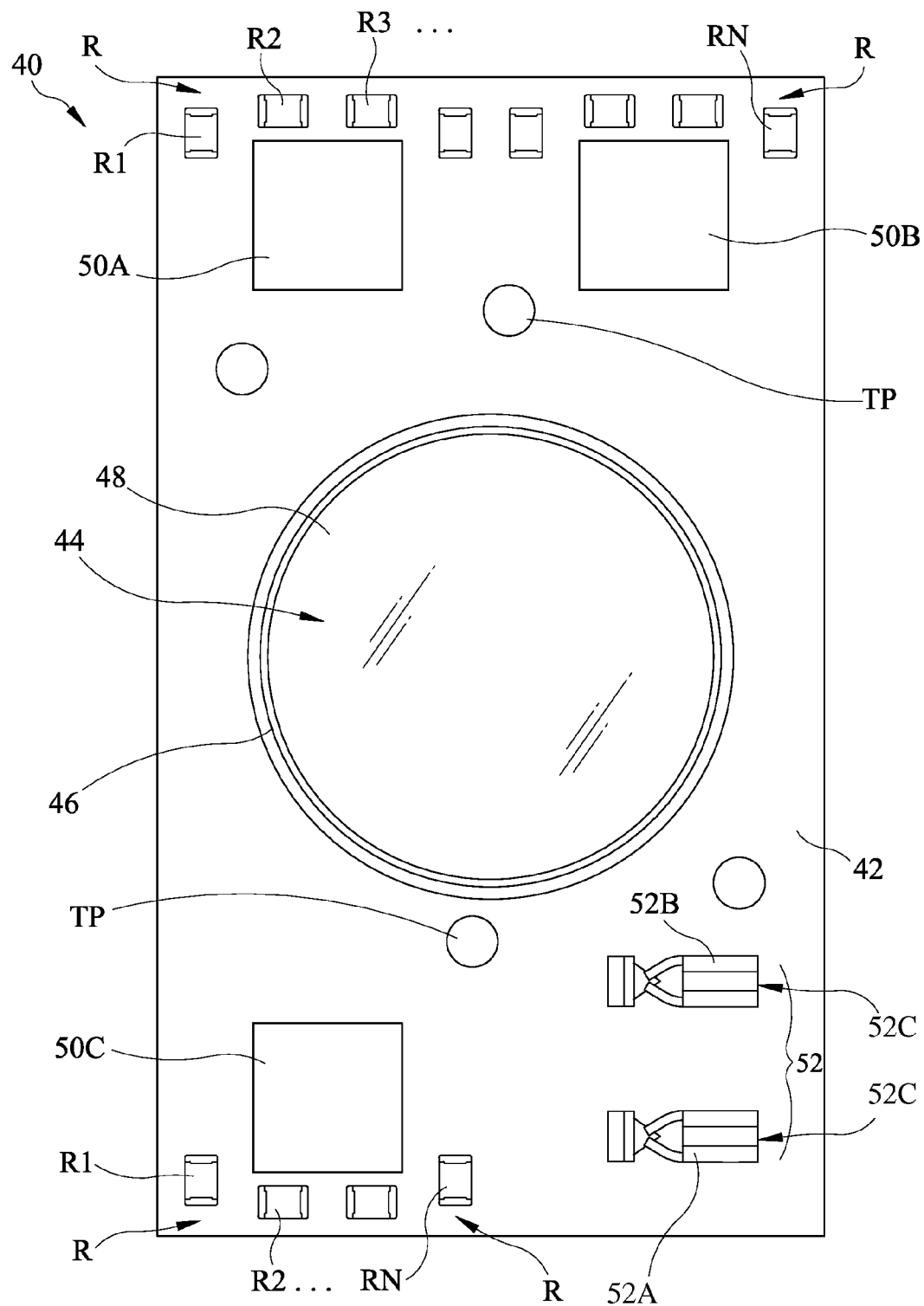
FIGS. 2A and 2B are various views illustrating another embodiment of a solid state lighting apparatus including multiple solid state light emitters and associated circuitry, on or over a substrate according to some aspects.
Figure 2B:
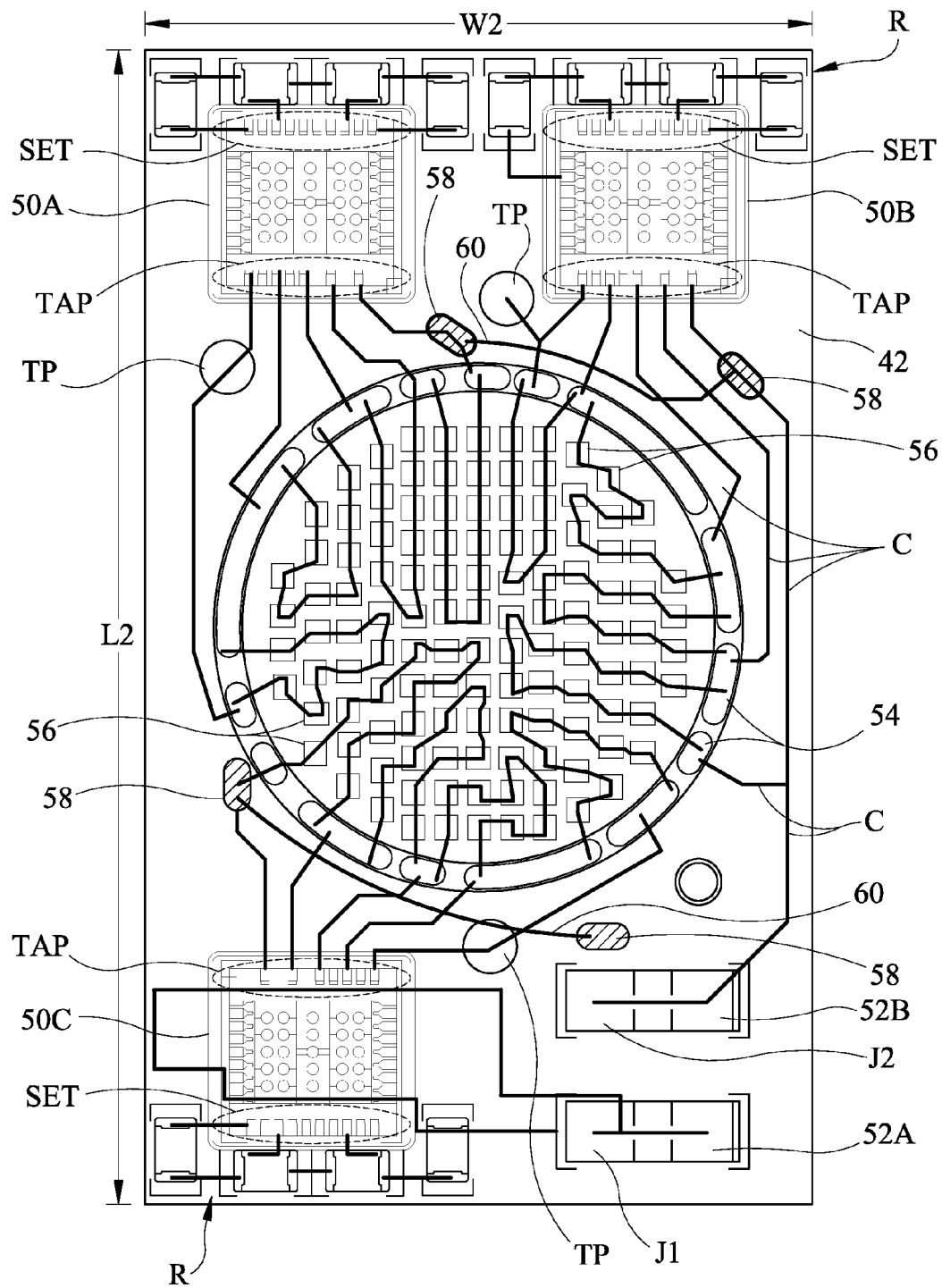

Electrical traces 32 can be disposed about mounting area 34 and comprise electrically conductive portions of material (e.g., metallic material, metal, metal alloy, Cu, Ag, Ti, Au, Pt, Sn, Ni, Pd, HASL or combination thereof), of opposing polarity for passing current through LED chips/segments (FIG. 2B). As FIG. 1E illustrates, traces 32 can be arranged in a substantially annular or circular pattern. However traces 32 can form any suitable pattern for minimizing space and/or size of substrate 12, where desired.

In some aspects, portions of mounting area 34 and electrical traces 32 are covered by a dam or reflective retaining member or structure (e.g., 16, FIG. 1A) to reduce loss of light and to prevent corrosion or other degradation thereof. Mounting area 34 can be electrically conductive for supporting horizontally structured LED chips (e.g., having bond pads of opposing electrical polarity disposed on a bottom surface of each LED chip) and/or vertically structured LED chips (FIG. 2B). In some aspects, mounting area 34 is non-electrically conductive. LED chips (56, FIG. 2B) can comprise horizontally structured LED chips having bond pads of opposing electrical polarity disposed on a top surface thereof. Any type, size, structure, build, shape, and/or color of LED chips 34 can be used.

Still referring to FIGS. 1E and 1n some aspects, apparatus 10 is directly driven using rectified AC current, and is voltage configurable by passing current at any user-selected voltage via drive components 20. Drive components can be mounted in series and/or in parallel. In some aspects, electrical and optical properties of apparatus 10 are measured via connecting to one or more test points, generally designated TP.

Electrical current passes into apparatus via four wires (designated RED, BLUE, BLACK, and WHITE), which can connect to apparatus via clamping, soldering, bonding, etc. with or to connectors 22. Wires can be inserted within connector housing, or otherwise directly connect to electrical terminals J1, J2, J3, and J4 of apparatus 10. Wires (e.g., RED, BLUE, BLACK, and WHITE) can comprise multiple sets of two wires of opposing (e.g., positive/negative) polarity for passing rectified AC current into apparatus 10 setting the drive currents of the various set lines or "SET" lines. Current can pass through resistors and into drive components 20 for driving/illuminating LED chips and/or LED segments (FIG. 2B). LED chips (FIG. 2B) that are switchable on/off at different times during an AC waveform by virtue of connection to different tap lines, generally designated "TAP" of drive comment 20.

Drive component 20 can selectively supply current to different tap lines TAP for selectively supplying current to different solid state light emitters according to various user-defined line voltages of 90 V or more; 120 V or more; or 240 V or more. Drive components 20 comprise one or more input circuits or set lines, generally designated "SET" lines. Drive components 20 comprise input SET lines and output TAP lines configured to control an amount of current that is routed or pushed into respective LED chips/segments (FIG. 2B) disposed over mounting area 34.

As noted above, a plurality of electrically and/or thermally conductive vias 30 can be internally disposed within substrate 12 and below the plurality of drive components 20 for improving thermal management and heat dissipation of electrical components through substrate 12. In some aspects, vias 30 are disposed through a dielectric portion or layer of substrate 12. Vias 30 can also provide electrical and thermal communication between drive components 20 and a second, lower trace layer of substrate 16, where desired for passing current vertically within apparatus 10 (see e.g., lower trace (s) 60, FIG. 2B).

FIGS. 2A and 2B illustrate another embodiment of a solid state light emitting apparatus, generally designated 40. Apparatus 40 is similar in form and function to apparatus 10; however, apparatus 40 comprises three or more direct drive components, designated 50A, 50B, and 50C. Direct drive components 50A to 50C can comprise packaged driving devices, such as packaged IC power chips, supported over a substrate 42 for activating and deactivating solid state light emitters (e.g., 56, FIG. 2B) during a portion of an AC wave cycle.

A light emission area 44 is also disposed over and supported by substrate 42. Emission area 44 comprises a plurality of solid state light emitters (56, FIG. 2B) disposed below a filling material 48. A retention dam or retaining structure 46, which is optionally reflective, is disposed outside of filling material 18. Retaining dam 16 can comprise a reflector or reflective structure.

In some aspects, substrate 42 also supports electrical components or circuitry components, such as one or more resistors, generally designated R. A plurality of resistors R can be provided per apparatus 40, such as individual resistors designated R1 to RN (where N is a whole number integer >1). Resistors R can be disposed about each drive component 50A to 50C for regulating current and/or reducing flicker. A pair of connectors, generally designated 52 is disposed over substrate. In some aspects, electrical wires (e.g., E, FIG. 1C) are configured to connect to apparatus 40 via connectors 52. Each individual connector 52A and 52B of the pair of connectors can comprise an outer portion with an opening or wire receiving portion 52C. Electrical current can pass into apparatus 40 when wires (e.g., E, FIG. 1C) physically and/or electrically connect to connectors 52. Optical and electrical properties of apparatus 40 can be tested via connection to one or more test points TP of substrate 42.

FIG. 2B is a view of apparatus 40 without retention material 46, filling material 48, and/or a layer of solder mask such that electrical connectors, connections, and/or electrical traces are more readily visible. FIG. 2B is illustrative of various electrical components, traces, circuitry, connectors, LED chips 56, and drive components 50A to 50C prior to masking or otherwise covering traces with electrically insulating and/or reflective coverings (e.g., solder mask).

In some aspects, LED chips 56 are serially connected into strings or segments via electrical carriers C such as wires or wirebonds. Each string of LED chips 56 can comprise a plurality of "chip-on-board" (COB) chips electrically coupled or connected in series or parallel with one another and mounted on a portion of substrate 42. In some aspects, each string of serially connected LED chips 56 is electrically connected in parallel with and/or to other strings (not shown). In some aspects, COB LED chips 56 can be mounted directly on portions of substrate 42 without the need for additional packaging.

For example, in some aspects LED chips 56 can comprise serial arrangements of differently colored LED chips available from Cree, Inc. of Durham N.C. LED chips 56 can receive power or current from different drive components 50A to 50C. LED chips 56 can be electrically connected in series, parallel, or combinations thereof.

Still referring to FIG. 2B and in some aspects, LED chips 56 can be arranged in different strings or segments, each of which has a different or targeted CCT value for dimming. For example, in some aspects, at least one string of LED chips 56 is characterized as having a particular CCT value which is different from at least one other string of LED chips 56. In other aspects, at least one string of LED chips 56 is characterized as having a particular CCT value which is different from each other LED segment. Accordingly, as dimming proceeds, the light output from apparatus 40 shifts in CCT value according to the combination of each LED segment toward a targeted CCT value, such as reversibly dimming between approximately 2700K and 1800K.

The plurality of LED chips 56 can be mounted over substrate 42 and electrically connected to one or more traces 54 via electrical connectors or carriers C. In some aspects, carriers C comprise wire bonds; however, carriers C can also comprise traces plated over substrate 42 for providing electrical connectivity between various components (e.g., LED chips, resistors, power chips, etc.) of apparatus 40. Drive components 50A to 50C can comprise one or more packaged IC chips having a plurality of input circuits or set lines, generally designated "SET" lines and a plurality of output lines, generally designated "TAP" lines. Drive components 50A to 50C comprise input SET lines and output TAP lines configured to control an amount of current that is routed or pushed into respective LED chips 52 (e.g., and strings thereof) mounted over substrate 42. Electrical current can enter apparatus 40 via wire receiving portion 52C, which connect directly to apparatus terminals J1 and J2. Current can pass into apparatus 40 via terminals J1 and J2, which comprise positive and negative terminals. The collective voltage of LED chips 56 is operable at a user-defined line voltage, which can vary between approximately 90 VAC and 240 VAC, in some aspects, between 120 VAC and 240 VAC.

Apparatus 40 can comprise a length L2 and a width W2 of any dimension. In some aspects, substrate 42 can comprise a rectangle of a width W2 and a length L2 of approximately 10 mm or more x 20 mm or more. Any size and/or shape of substrate 42 can be provided. In some aspects, at least 20 or more solid state light emitters are provided over substrate 42, at least 50 or more solid state light emitters are provided over substrate 42, at least 100 or more solid state light emitters are provided over substrate 42, or at least 120 or more solid state emitters are provided over substrate 42. Similarly, at least two drive components (e.g., 50A to 50C) can be provided over substrate 42, at least three drive components can be provided over substrate 42, at least four components drive can be provided over substrate, or more than four drive components can be provided over substrate 42.

In some aspects, substrate 42 comprises multiple trace layers, having traces disposed along different planes. For example, a first layer of traces 54 can be provided that is non-planer with a second layer of traces 60. Second layer of traces 60 can be disposed along a plane that is different from (e.g., above or below) first layer of traces 54. In some aspects, second layer of traces 60 is disposed along a bottom surface of apparatus. Second layer of traces 60 can connect to first layer of traces 54 via electrically conductive vias located in regions 58. Regions 58 can also contain both top and bottom trace layers.

As FIG. 2B illustrates, each driving component 50A to 50C is configured to drive different sets or strings of LED chips 56. For example, first driving component 50A is configured to drive one or more strings of LED chips 56, second driving component 50B is independent from first component 50A, and configured to drive other (e.g., mutually exclusive and separately switchable) strings of LED chips 56, and third driving component 50C is configured to drive at least four other strings of LED chips 56. More than three driving components 50A to 50C can be provided, and each component can drive at least one string of chips 56, at least two strings of chips 56, at least three strings of chips 56, at least four strings of chips 56, or more than four strings of chips 56. In some aspects, apparatus 40 driving components are individual operable and/or mutually exclusive for providing more efficient dimmable apparatuses.

A particular spectral power distribution can be generated by the combination of all of the LED chips 56 and/or segments when the light is full on, for example. When the light is dimmed, however, the current provided to the targeted LED chips 56 or strings is mostly maintained and the current to the non-targeted LED chips 56 or strings is greatly reduced so that the spectral power distribution shifts toward a targeted spectral power distribution that is pre-defined by the LED chips 56 included in the targeted LED segment. Accordingly, the targeted spectral power distribution can have different lighting characteristics than that provided by the combination of all LED chips 56 or segments.

When all segments are activated or powered "on", the apparatus can emit a color temperature that is that tuned to approximately 2700K or approximately 3000K, and a light output of approximately 4000 lumens and approximately 90 LPW or more. As each segment, turns from "on" to "off", the light warms from approximately 2700K (e.g., or about 3000K) to 1800K as it dims. It is understood that control of separately switchable LED chips and/or segments may further be provided according to any method. For example, in some aspects according to the present subject matter, the switching may be provided using the techniques described in commonly assigned U.S. Pat. No. 8,476,836, the disclosure of which is incorporated herein by reference.

Referring to direct drive control circuitry or components 50A to 50C, each component can comprise a packaged or housed IC opponent, such as a power chip, configured to supply electrical current to each LED chip 56, or groups of LED chips 56. Each LED within a string of chips 56 can receive a same amount of electrical current or different amounts of electrical current at various times for achieving a desired amount of illumination, color, and/or color temperature from each of the plurality of LED chips 56 and respective strings of chips. In some aspects, some LED chips 56 or segments remain "on", while others remain dark or "off". In some aspects, each LED chip 56 and/or respective LED segment is individually controlled for providing any illumination level and/or color temperature between a fully "on" state and any dimmed state that is below the fully "on" state.

Components 50A to 50C are configured to receive a direct, rectified AC signal and controlling current supplied to a plurality of LED chips 54. Components 50A to 50C can control an amount of electrical current collectively and/or individually supplied to LED chip 56 in response to a change in line voltage, a control signal, an input, or any other control parameter. For example, components 50A to 50C can supply current collectively and/or individually to one or more LED chips and/or segments in response to activation or physical movement of a dimmer switch, a pre-set condition, a user-defined condition, one or more inputs or other control parameters, any perceptible change in line voltage, or a sensor arranged to sense or detect electrical, optical, environmental and/or thermal properties.

In some aspects, components 50A to 50C can comprise what is referred to as a "smart" power chip. The power chip is configured to monitor the input voltage and determine at what times or portions of a rectified AC waveform the LED chips 56 disposed in segments be switched "on" and "off". In some aspects, components comprise a control circuit adapted to issue control commands for activating and/or deactivating LED chips 56 in response to processing the monitored changes of input voltage.

In some aspects, components 50A to 50C comprise a flat no-lead IC package, for example, a quad-flat no-lead (QFN) surface mount package, a dual-flat no-lead (DFN) surface mount package, and/or a micro leadframe package (MLP). Such packages are configured to physically and electrically connect to portions of substrate 42 via electrically conductive members, portions, and/or surfaces thereof, such as exposed metallic leads.

Flat no-lead packages refer to packages having leadframe substrates, however, the "leads" are not externally extending from lateral sides of the package, for example, in a J-bend or gull-wing type configuration. Rather, components 50A to 50C can comprise a near chip sized package having a planar copper lead frame substrate encapsulated in plastic. Perimeter leads on a bottom surface of an encapsulated or un-encapsulated package component 50A provide a direct electrical connection between chips 56 and other electrical components provided on or over substrate 42. In some aspects, components 50A to 50C comprise an exposed thermal pad for improving heat transfer out of the chip and into substrate 42. In some aspects, one or more through holes or "vias" can be provided in the substrate 42 below the thermal pad of components 50A to 50C for improving thermal management within apparatus 40.

Figure 3A:
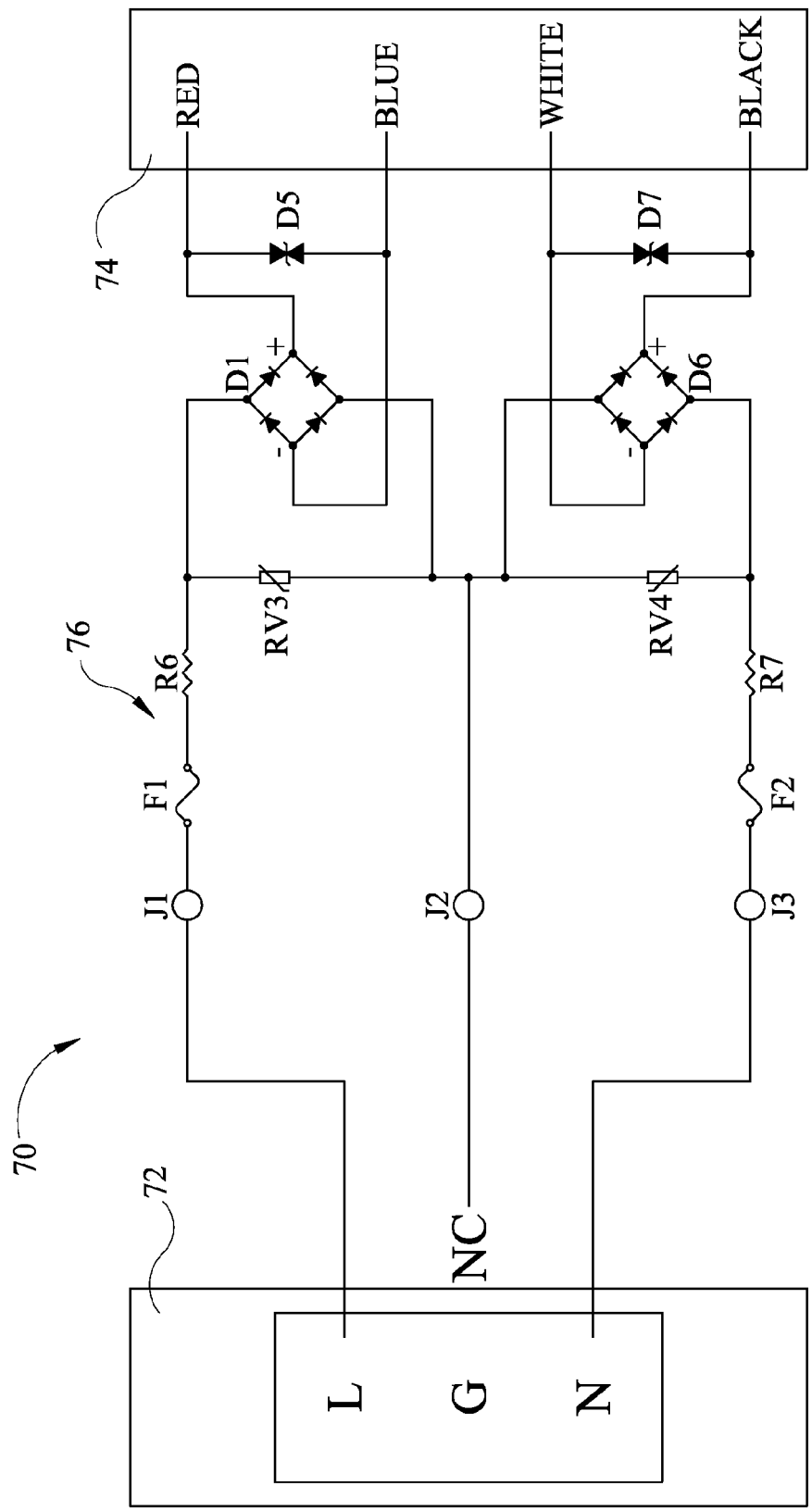
FIGS. 3A, 3B, and 4 are schematic circuit diagrams for providing operability of solid state lighting apparatuses at multiple different (e.g., user-defined) voltages according to some aspects.
Figure 3B:
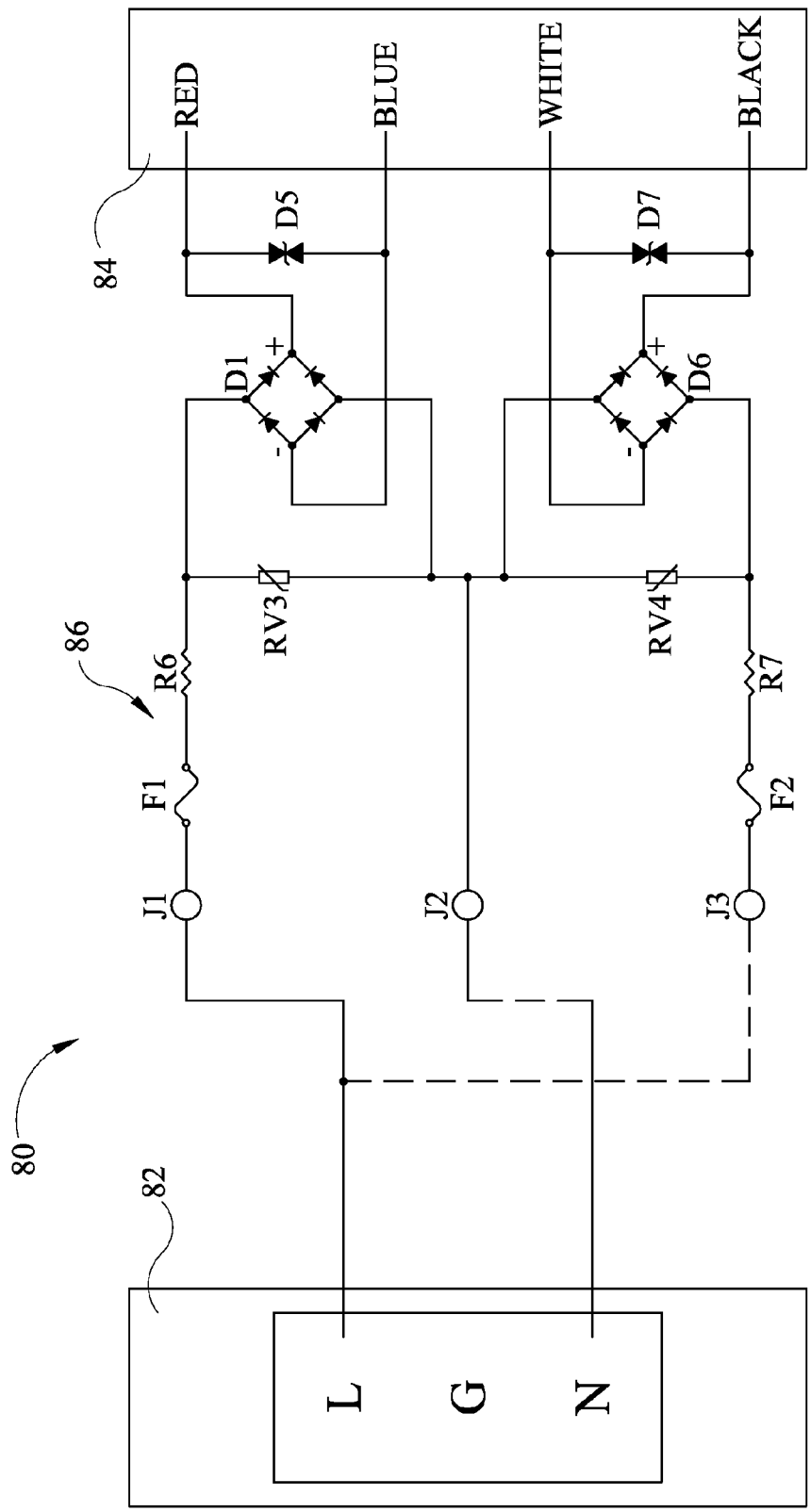

FIGS. 3A and 3B are schematic circuit diagrams illustrating solid state light emitter subsystems, in which the solid state lighting apparatuses are operable at multiple different (e.g., user-defined) voltages. Systems 70 and 80 are similar, with the exception of the wiring designated by broken lines in FIG. 3B. That is, system 80 is one variation of system 70, which illustrates operability of one apparatus at various voltages by varying connectivity of terminals (i.e., J1 to J3) to terminals (i.e., L and N).

Referring to FIG. 3A, a solid state light emitting system, generally designated 70, is shown. System 70 includes and/or works in conjunction with a user-provided AC line input or input device 72, and a voltage configurable solid state lighting apparatus 74 (e.g., similar in form/function to apparatus 10) having four wired terminals, the wires being designated as RED, BLUE, WHITE, and BLACK. Similarly and referring to FIG. 3B, a solid state light emitting system, generally designated 80, is shown. System 80 includes and/or works in conjunction with a user-provided AC line input or input device 82, and a voltage configurable solid state lighting apparatus 84 (e.g., similar in form/function to apparatus 10) having four wired terminals, the wires being designated as RED, BLUE, WHITE, and BLACK.

FIGS. 3A and 3B illustrate provision of a separate, intermediate circuit components 76 (FIG. 3A) and 86 (FIG. 3B) within each respective system, where the intermediate components 76 and 86 can be disposed between the AC line input (e.g., 72, 82) and the solid state lighting apparatus (e.g., 74, 84) for reducing the 4-wire selection of apparatus 74/84 to a two wire selection of line (L) and neutral (N). This allows operability of apparatus 74/84 at either of two user-selected voltages. Note, FIGS. 3A and 3B illustrate a same circuitry subsystem, with the exception of the broken lines indicated in FIG. 3B, which illustrates connectivity of devices on one of two user-selected voltages, allowing a single device to be used in multiple different lighting applications and circuitry schemes. In FIG. 3A, terminal J2 is not connected as indicated by a non-connected NC line or state.

FIG. 3A illustrates an embodiment of a solid state lighting system 70 and apparatus 74 operable at approximately 240 V. FIG. 3B illustrates and embodiment of a solid state lighting system 80 and apparatus 84 operable at approximately 120 V.

In some aspects, user-defined circuitry component 72 and 82 comprises a plug, or a wired component adapted for connection to voltage configurable with solid state lighting apparatus 74/84, which may comprise a socket. Customer defined portions 72 and 82 comprise access to a live or line wire (L), a ground wire (G), and a neutral wire (N). Customer provided portions 72/82 set or define the voltage to which voltage configurable apparatus 74/84 must be able to adapt. This enables operability of the lighting apparatus in various countries, such as the United States, Canada, and Europe without modification.

As FIGS. 3A and 3B illustrate, intermediate circuits 76 and 86 comprise user-configurable or user-selectable circuits for rectifying AC current and providing surge protection and/or electrostatic discharge (ESD) protection during operation. According to some aspects, intermediate circuits 76 and 86 in FIGS. 3A and 3B plug into or otherwise connect with apparatus lines, or the RED, BLUE, WHITE, and BLACK lines shown in FIG. 1E. Intermediate circuits include transient voltage suppression (TVS) protection devices D5 and D7 per each pair of device lines (e.g., positive/negative pairs). Intermediate circuits and 76 and 86 further comprises at least one rectifying circuit (e.g., a diode bridge) designated D1 and D6 per set of apparatus lines (e.g., RED/BLUE and WHITE/BLACK). Intermediate circuits and 76 and 86 further comprise at least one surge protection element or surge protection circuitry, designated RV3 and RV4 in parallel with each diode bridge D1 and D6. Surge protection circuitry RV3 and RV4 can reduce or eliminate transmission of voltage transients exceeding the permissible limits to apparatus 74 or 84, each of which have LED chips disposed thereon. Current can flow through one or more terminals J1 to J3 of the user defined circuit, and across one or more fuses F1, F2 and/or resistors R6, R7, which collectively work with the surge protection circuitry RV3 to RV4 to reduce the effects of surge events. End-users may provide terminals J1 to J3 by which the user can select a desired voltage and/or a series or parallel connection for the plurality of driving components within apparatus 74 or 84.

Customer provided portions 72 and 82 in FIGS. 3A and 3B can provide an alternating electrical signal (current and voltage) to apparatus 74 and 84. In some aspects, AC voltage signal is directly provided to rectifier circuits D1 and D6, such as diode bridges. Diode bridges D1 and D6 provide a rectified AC voltage signal having a rectified (positive waveform). Power chips (e.g., 50A to 50C, FIG. 2B) are adapted to switch the rectified signal through LED chips, for example, by pushing more current into some segments and/or bypassing other segments via set/tap lines. In some aspects, LED chips (56, FIG. 2B) are activated and/or deactivated during different portions of an AC waveform. It is appreciated that various aspects described herein can make use of the direct application of AC voltage to a lighting apparatus (e.g., from an outside power source, not shown) without the inclusion of an "on-board" switched mode power supply.

Figure 4:
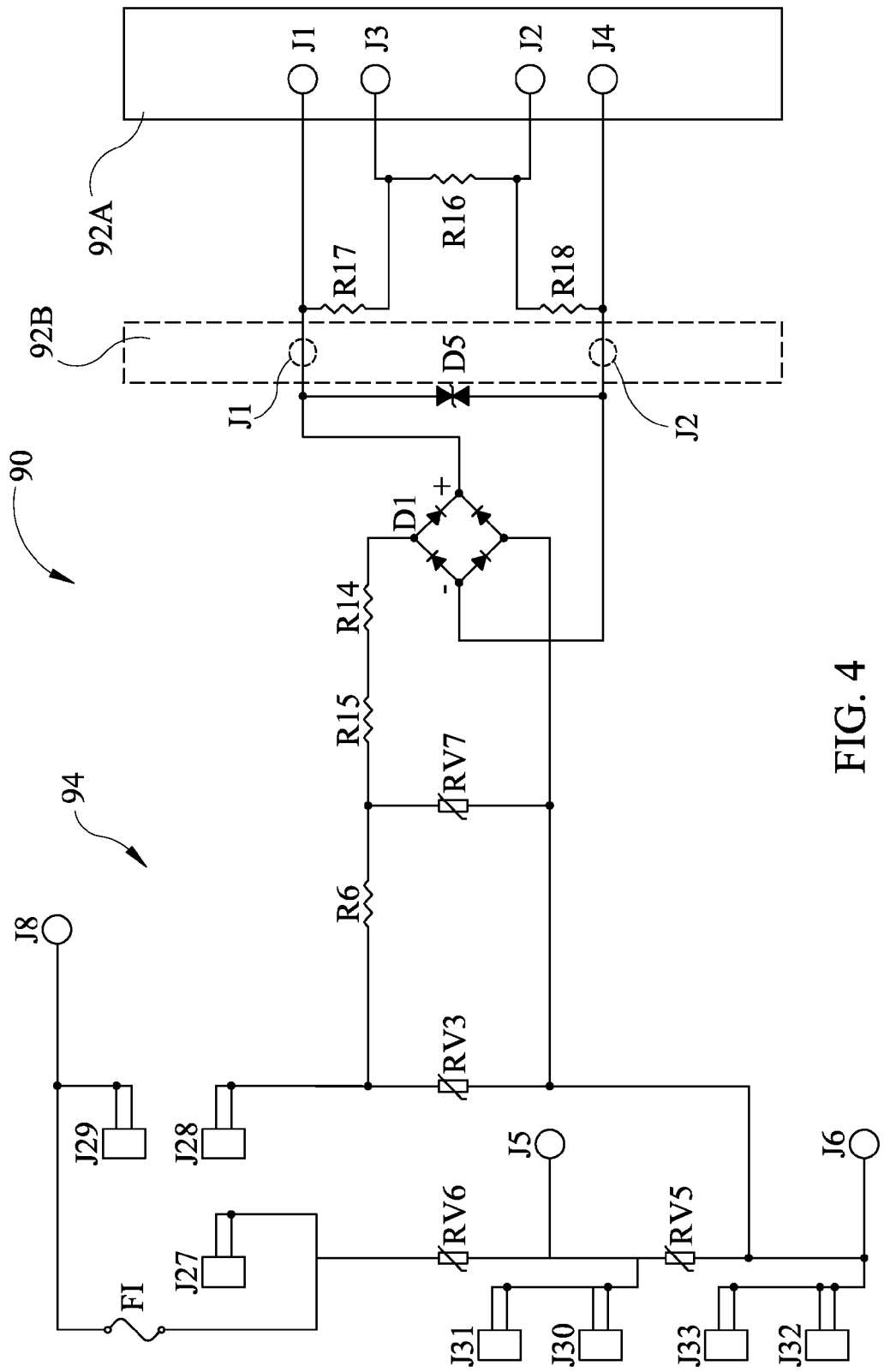

FIG. 4 is another embodiment of a solid state lighting system, generally designated 90, for user-selectable voltage. System 90 comprises a lighting apparatus 92A or 92B, that is similar to apparatus 10 described hereinabove. Apparatus 92A comprises two lines or contacts or terminals J1 and J2, similar to apparatus 40. Apparatus 92A and terminals J1 and J2 are illustrated in broken lines to denote one optional/possible placement of the component terminals within the circuit. Apparatus 92B includes four lines (e.g., BLUE, BLACK, etc.) and four terminals (J1 to J4) comprising two sets of positive/negative terminals, similar to apparatus 10.

System 90 comprises a TVS protection device D5 and a rectifying circuit or rectifying bridge D1 for rectifying the AC current. TVS protection device D5 and bridge D1 can be disposed on a surface of apparatus (e.g., 92A, 92B), or over a separate board or substrate, where desired.

Surge protection can be provided by one or more electrical components, designated RV3, RV5, RV6 and RV7 for eliminating transmission of voltage transients exceeding the line voltage. Resistors R14 and R15 can provide surge protection or jumpers. Resistors R16, R17, R18 can be used to selectee voltage in conjunction with one or more fuses F1. System 94 can be operable at any voltage, such as any line voltage supplied via system terminals J27 to J32. Table 1 below illustrates two possible configurations for system 90 in FIG. 4.

TABLE 1

| CONFIGURATION | R16 | R17 | R18 |
|---|---|---|---|
| LOW VOLTAGE, 120 V | OPEN | SHORT | SHORT |
| HIGH VOLTAGE, 240 V | SHORT | OPEN | OPEN |

In Table 1 above, the term "short" indicates that the resistor is providing zero resistance (0Ω) and "open" indicates that the resistance is infinite (e.g., ∞Ω). Systems, apparatuses, and methods herein are voltage configurable and can accommodate any desired voltage level and different voltage levels for different applications. For illustration purposes, apparatus and systems herein are operable at both 120V and 240V. LED chips and/or segments are configured to be activated "on" and/or deactivated "off" via switching at different times relative to one another during a portion of an AC cycle, and are configured to operate within about 3 percent or more of a root mean square (RMS) voltage of the AC power source (e.g., "AC line in"). In certain aspects, the AC power source has a nominal RMS voltage of at least about 100V, such as including approximate values of 90V, 110V, 120V, 170V, 220V, 230V, 240V, 277V, 300V, 480V, 600V higher voltages, or any approximate or subset of voltage. Apparatuses and systems herein are operable at customer-provided voltage levels, where desired, and can be operable at a same or different voltage levels depending upon the number and/or wired configuration (e.g., series/parallel connections) of drive components, such as power chips. In some aspects, the voltage at which the collective LED chips or segments operate can add up or sum to a line voltage of a user defined circuit.

Apparatuses and systems herein can deliver approximately 90 LPW or more in select color temperatures, such as between approximately 1800K and 3000K (i.e., nominally 2700K). In other aspects, apparatuses and systems herein can deliver approximately 90 LPW between approximately 5700K and 4000K, which may not be specifically used for and/or designed for dimmable applications. In some aspects, apparatuses and systems herein target a color temperature of between approximately 1800K and 6000K. In some aspects, substrate of apparatuses herein can comprise a form factor suitable for drop-in or plug-in replacement of standard light bulbs, elongated fluorescent tube-type bulbs, or replacement of fluorescent light fixtures.

Aspects as disclosed herein can provide one or more of the following beneficial technical effects: drop-in or plug-in apparatuses; voltage configurable apparatuses; selectively configurable apparatuses; reduced cost of solid state lighting apparatuses; reduced size or volume of solid state lighting apparatuses; reduced perceptibility of flicker of solid state lighting apparatuses operated with AC power; reduced perceptibility of variation in intensity (e.g., with respect to area and/or direction) of light output by solid state lighting apparatuses operated with AC power; reduced perceptibility of variation (e.g., with respect to area and/or direction) in output color and/or output color temperature of light output by solid state lighting apparatuses operated with AC power; improved dissipation of heat (and concomitant improvement of operating life) of solid state lighting apparatuses operated with AC power; improved manufacturability of solid state lighting apparatuses operated with AC power; improved ability to vary color temperature of emissions of solid state lighting apparatuses operated with AC power; improved light extraction; reduced absorption of light by driver circuitry components; and reduced impingement of light upon driver circuitry or electrical components of a solid state lighting apparatus.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

FIGS. 5A to 5E illustrate another embodiment of a solid state light emitting apparatus, generally designated 100. Apparatus 100 can be similar in form and function to apparatus 40 (FIGS. 2A and 2B), however, apparatus 100 comprises a modified light emission area (e.g., modified size, shape), increased percentage epi (e.g., as a percentage of the emission area), modified LED chips, rebalanced and optimized strings (e.g., having improved efficiency), and/or reduced power, as discussed below.

Referring to FIGS. 5A to 5E in general, apparatus 100 can comprise three or more direct drive components, designated 102A, 102B, and 102C and two input/output terminals 104A and 104B supported on or over an apparatus substrate 106 for collectively receiving and distributing electrical current or signal within portions pf apparatus 100. Direct drive components 102A to 102C can comprise packaged driving devices, such as packaged IC power chips, supported over a substrate 106 for activating and deactivating a plurality of solid state light emitters (e.g., 112, FIG. 5E) during a portion of an AC wave cycle. Input/output terminals 104A and 104B are also supported on or over substrate 106 for supplying power to and illuminating the plurality of light emitters (e.g., 112, FIG. 5E) arranged within a light emitter area, generally designated 108. Substrate 106 can comprise a PCB, MCPCB, high reflectively $Al_2O_3$, AlN, etc.

In some aspects, light emitter area 108 is disposed over and/or supported by substrate 106 and comprises a plurality of solid state light emitters (e.g., 112, FIG. 5E) disposed below a filling material 110. A retention dam or retaining structure RS, which is optionally reflective, is disposed outside of filling material 110. In some aspects, retaining structure RS can comprise a reflector or reflective structure. Filling material 110 can comprise silicone, epoxy, and encapsulant with or without phosphors contained therein. Where used, phosphors may be uniformly or non-uniformly disposed (e.g., settled or in a gradient) within filling material 110.

In some aspects, apparatus substrate 106 also supports electrical components or circuitry components, such as one or more resistors, generally designated R. A plurality of resistors R can be provided per apparatus 100, such as individual resistors designated R1 to RN (where N is a whole number integer >1). Resistors R can be disposed about each drive component 102A to 102C for regulating current and/or reducing perceptible flicker. Electrical wires (not shown) extending from a power source are configured to connect to apparatus 100 via terminals 104A and 104B. Electrical current can pass into apparatus 100 when wires (e.g., not shown but see wires, E, FIG. 1C) physically and/or electrically connect to terminals 104A and 104B. Optical and electrical properties of apparatus 100 can be tested via connection to one or more test points TP of substrate 106. Test points TP can be used for electro-optical testing and verification during production, for example, before driver chips are installed.

Figure 5C:
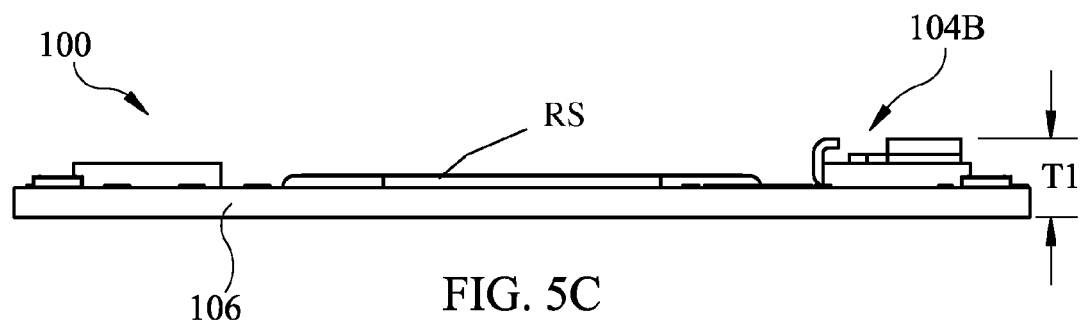
Figure 5D:
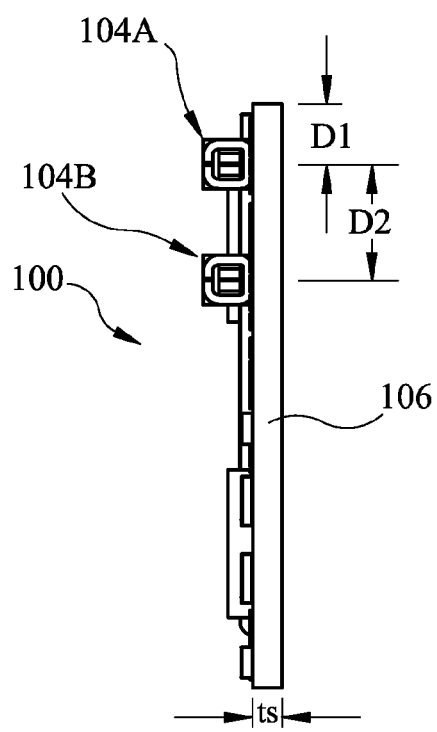

FIGS. 5B to 5D illustrate various dimensions associated with apparatus 100. Referring to FIG. 5B, apparatus 100 can, in some aspects, comprise a rectangle shape having an overall width W1 and an overall length L1 of at least approximately 20 mm×40 mm, such as approximately 24 mm×42 mm, or more specifically, 23.8 mm×41.3 mm. Apparatus 100 can comprise a half width W2 of approximately 12 mm (e.g., 11.9 mm) and half-length L2 of approximately 21 mm (e.g., 20.6 mm).

In some aspects, apparatus 100 comprises light emitter area 108 having a substantially square shape of an overall width W4 and an overall length L4 of approximately 20 mm×20 mm, such as 19.4 mm×19.4 mm. Emitter area 108 can comprise an emitter surface of a width W3 and a length L3 (i.e., that does not include the dimension of retention structure RS), which is approximately 18 mm×18 mm (e.g., 17.8 mm×17.8 mm). Thus, emitter area 108 can comprise a surface area of approximately 300 $mm^2$ or more over a substrate 106 having a surface area of approximately 980 $mm^2$ or more. Any size and/or shape of apparatus 100 can be provided.

Referring to FIG. 5C, apparatus 100 can comprise an overall thickness T1 of approximately 3 mm (e.g., 3.3 mm). Referring to FIG. 5D, substrate 106 can comprise a thickness $t_s$ of approximately 1.2 mm. Terminals 104A and 104B can be disposed at least a first distance D1 of approximately 2.5 mm inboard of outermost (lateral) sides of substrate 106, and terminals 104A and 104B can be spaced apart a distance D2 of approximately 4.7 mm. Dimensions set forth herein are exemplary and for illustration only, as apparatus 100 can scale up or down to any size, comprise any shape, and/or having components spaced at any suitable dimension with respect to substrate 106.

Figure 5E:
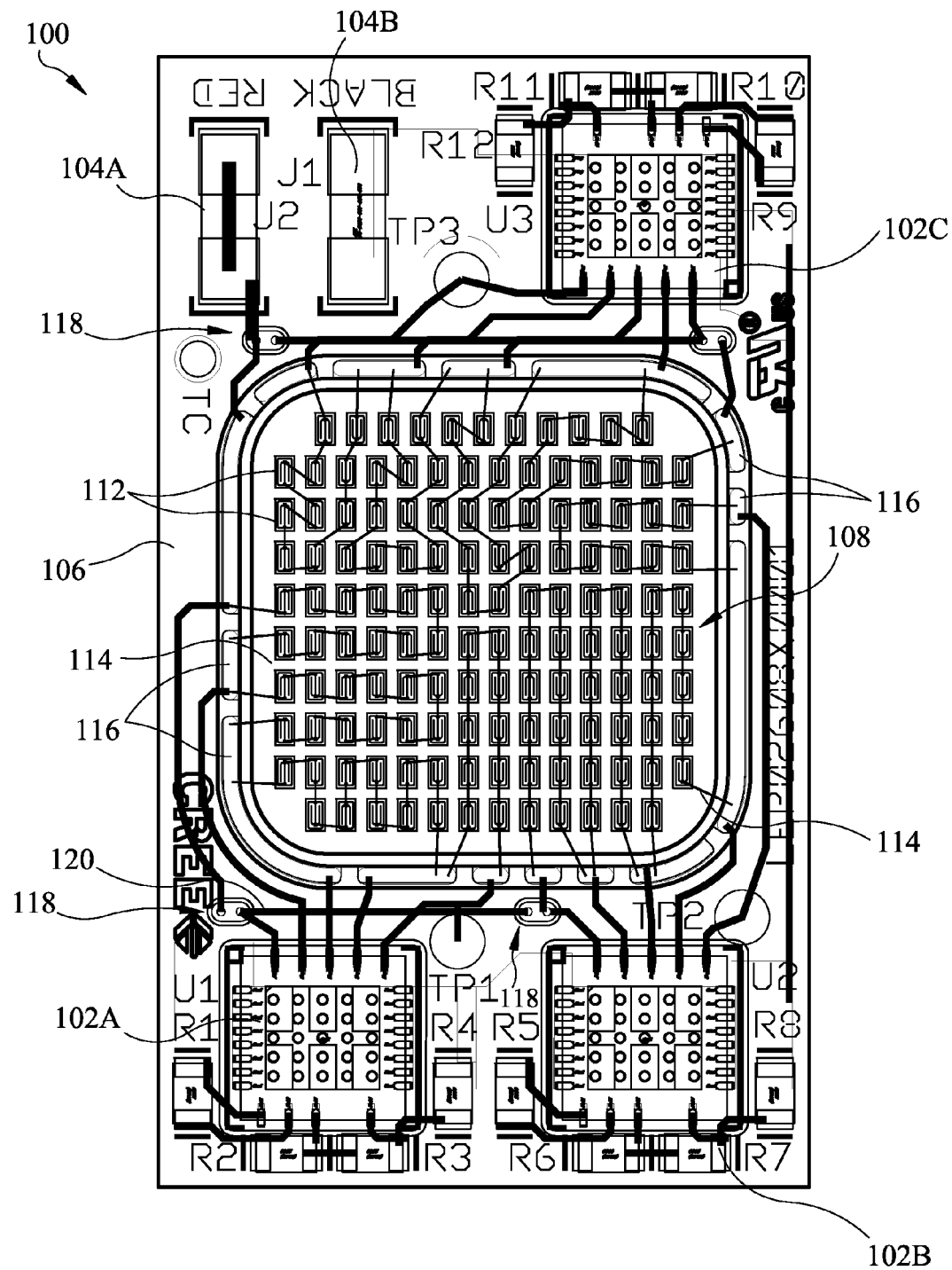

FIG. 5E is a view of apparatus 100 without retention material or structure RS, filling material 110, and/or a layer of solder mask such that electrical connectors, connections, and/or electrical traces are more readily visible. FIG. 5E is illustrative of various electrical components, traces, circuitry, connectors, LED chips 112, and drive components 102A to 102C prior to masking or otherwise covering traces with electrically insulating and/or reflective coverings (e.g., solder mask).

In some aspects, a plurality of LED chips 112 is serially connected into strings or segments via electrical carriers 114 such as wires or wirebonds. Each string of LED chips 112 can comprise a plurality of "chip-on-board" (COB) chips electrically coupled or connected in series or parallel with one another and mounted on a portion of substrate 106. In some aspects, each string of serially connected LED chips 112 is electrically connected in parallel with and/or to other strings (not shown) via connection to a plurality of traces 116. In some aspects, COB LED chips 112 can be mounted directly on portions of substrate 106 without the need for additional packaging. For example, in some aspects LED chips 112 can comprise serial arrangements of various wavelength LED chips (e.g., blue, green, UV, etc.). LED chips 112 can receive power or current from different drive components 102A to 102C via electrical communication between connectors 114 and traces 116. LED chips 112 can be electrically connected in series, parallel, or combinations thereof between terminals.

Still referring to FIG. 5E and in some aspects, LED chips 112 can be arranged in different strings or segments, each of which has a different or targeted CCT value for dimming. For example, in some aspects, at least one string of LED chips 112 is characterized as having a particular CCT value, which is different from at least one other string of LED chips 112. In other aspects, at least one string of LED chips 112 is characterized as having a particular CCT value, which is different from each other LED segment. Accordingly, as dimming proceeds, the light output from apparatus 100 shifts in CCT value according to the combination of each LED segment toward a targeted CCT value, such as reversibly dimming between approximately 2700K and 1800K.

Drive components 102A to 102C can comprise one or more packaged IC chips having a plurality of input circuits or set lines, and a plurality of output or tap lines. Drive components 102A to 102C comprise input set and tap lines configured to control an amount of current that is routed or pushed into respective LED chips 112 (e.g., and strings thereof) mounted over substrate 106. Electrical current can enter apparatus 100 via positive/negative terminals 104A to 104B and pass into and/or through apparatus 100. In some aspects, components 102A to 102C can comprise what is referred to as a "smart" power chip. The power chip is configured to monitor the input voltage and determine at what times or portions of a rectified AC waveform the LED chips 112 disposed in segments be switched "on" and "off". In some aspects, components comprise a control circuit adapted to issue control commands for activating and/or deactivating LED chips 112 in response to processing the monitored changes of input voltage. Exemplary components 102A to 102C comprise a flat no-lead IC package, for example, a quad-flat no-lead (QFN) surface mount package, a dual-flat no-lead (DFN) surface mount package, and/or a micro leadframe package (MLP). Such packages are configured to physically and electrically connect to portions of substrate 106 via electrically conductive members, portions, and/or surfaces thereof, such as exposed metallic leads.

In some aspects, drive components 102A to 102C comprise zero set resistors R (more integrated). In some aspects, drive components 102A to 102C have one or more set resistors R (less integrated). Drivers 102A to 102C may also consist of multiple discrete components such as multiple discrete control chips with separate controls. The function of each drive component 102A to 102C can be realized in different forms, including more integrated chips, less integrated chips, or combinations thereof.

In some aspects, at least 80 or more solid state light emitters 112 are provided over substrate 106, at least 100 or more solid state light emitters 112 are provided over substrate 106, at least 120 or more solid state light emitters 112 are provided over substrate 106, or at least 135 or more solid state emitters are provided over substrate 106. In some aspects, apparatus 100 comprises 135 LED chips arranged in 12 strings of chip. Similarly, at least three drive components 102A to 102C can be provided over substrate 106, or more than three drive components can be provided over substrate 106. In some aspects, emitters 112 comprise high voltage LED chips that are operable at 6 Volts (V), 9 V, 12 V, 18 V, 24 V, etc. Any number (low, high) of emitters 112 can be provided per apparatus 100. In some aspects, emitters 112 can comprise multiple junctions (e.g., high voltage chips) thus, apparatus 100 can comprise more than 120 junctions per surface area (e.g., of emitter area 108).

Solid state light emitters 112 can comprise any size and/or shape of chip. In some aspects, solid state light emitters 112 comprise LED chips that are approximately 685 μm×1135 μm for improving light extraction and brightness emitted by apparatus 100. The percentage of epi (e.g., active "light emitting" area) of emitters 112 can be increased per emitter area 108 by increasing the size of emitters 112 as well as the number of emitters per apparatus. Apparatus 100 is operable at about 50 watts (W) of power (e.g., 49.5 W, reduced from 54 W) and can emit at least approximately 20% more light than conventional devices. Apparatus 100 may be configured for operability at between approximately 10 W and 100 W, or in some aspects, more than 100 W.

In some aspects, substrate 106 comprises multiple trace layers, having traces disposed along different planes of apparatus 100. For example, a first layer of traces 116 can be provided that is non-planer with a second layer of traces 120. Second layer of traces 120 can be disposed along a plane that is different from (e.g., above or below) first layer of traces 116. In some aspects, second layer of traces 120 is disposed along a bottom of the PCB overlay (e.g., a bottom layer) of apparatus, and between one or more conductive elements, structures, or vias 118. Second layer of traces 120 can connect to first layer of traces 114 by passing current or signal using the electrically conductive vias 118.

A particular spectral power distribution can be generated by the combination of all of the LED chips 112 and/or segments when the light is full on, for example. When the light is dimmed, however, the current provided to the targeted LED chips 112 or strings is mostly maintained and the current to the non-targeted LED chips 112 or strings is greatly reduced so that the spectral power distribution shifts toward a targeted spectral power distribution that is pre-defined by the LED chips 112 included in the targeted LED segment. Accordingly, the targeted spectral power distribution can have different lighting characteristics than that provided by the combination of all LED chips 112 or segments.

When all segments are activated or powered "on", the apparatus can emit a color temperature that is that tuned to approximately 2700K or approximately 3000K, and a light output of approximately 5800 lumens and approximately 120 LPW or more. As each segment, turns from "on" to "off", the light warms from approximately 2700K (e.g., or about 3000K) to 1800K as it dims. It is understood that control of separately switchable LED chips and/or segments may further be provided according to any method. For example, in some aspects according to the present subject matter, the switching may be provided using the techniques described in commonly assigned U.S. Pat. No. 8,476,836, the disclosure of which is incorporated by reference herein.

In some aspects and on average, apparatus 100 can deliver approximately 125 LPW or more at 410 mA, 49 W of power, and 55° C. in select color temperatures, such as at approximately 4000K. Apparatus 100 is configured to realize all color points (e.g., CW to WW), including dim-to-warm applications. In some aspects, substrates of apparatuses herein can comprise a form factor suitable for drop-in or plug-in replacement of standard light bulbs, elongated fluorescent tube-type bulbs, or replacement of fluorescent light fixtures. In some aspects, apparatuses herein can be incorporated within a lighting fixture, such as a down lighting fixture, a can lighting fixture, a street lighting fixture, a high-bay lighting fixture, or a low-bay lighting fixture.

Apparatus 100 can comprise an output of at least approximately 100 lumens per watt (LPW) or more, at least about 120 LPW or more, at least approximately 125 LPW or more, at least approximately 130 LPW or more, or more than approximately 140 LPW. One or more of the foregoing LPW thresholds are attained for emissions having at least one of a cool white (CW) color temperature or a warm white (WW) color temperature. Apparatuses and systems described herein can be powered via approximately 50 W (more or less). When all segments are activated or powered "on", the apparatus can emit a color temperature that is that tuned to approximately 4000K, and a light output of between approximately 5800 to 7000 lumens and approximately 120 LPW or more (at 410 mA and 55° C.).

Apparatus 100 can further comprise an increased thermal performance (e.g., less droop) in addition to the improved brightness and LPW values. At elevated temperatures greater than 55° C., apparatus can maintain a minimum emission of 120 LPW, even approaching 100° C.

Figure 6A:
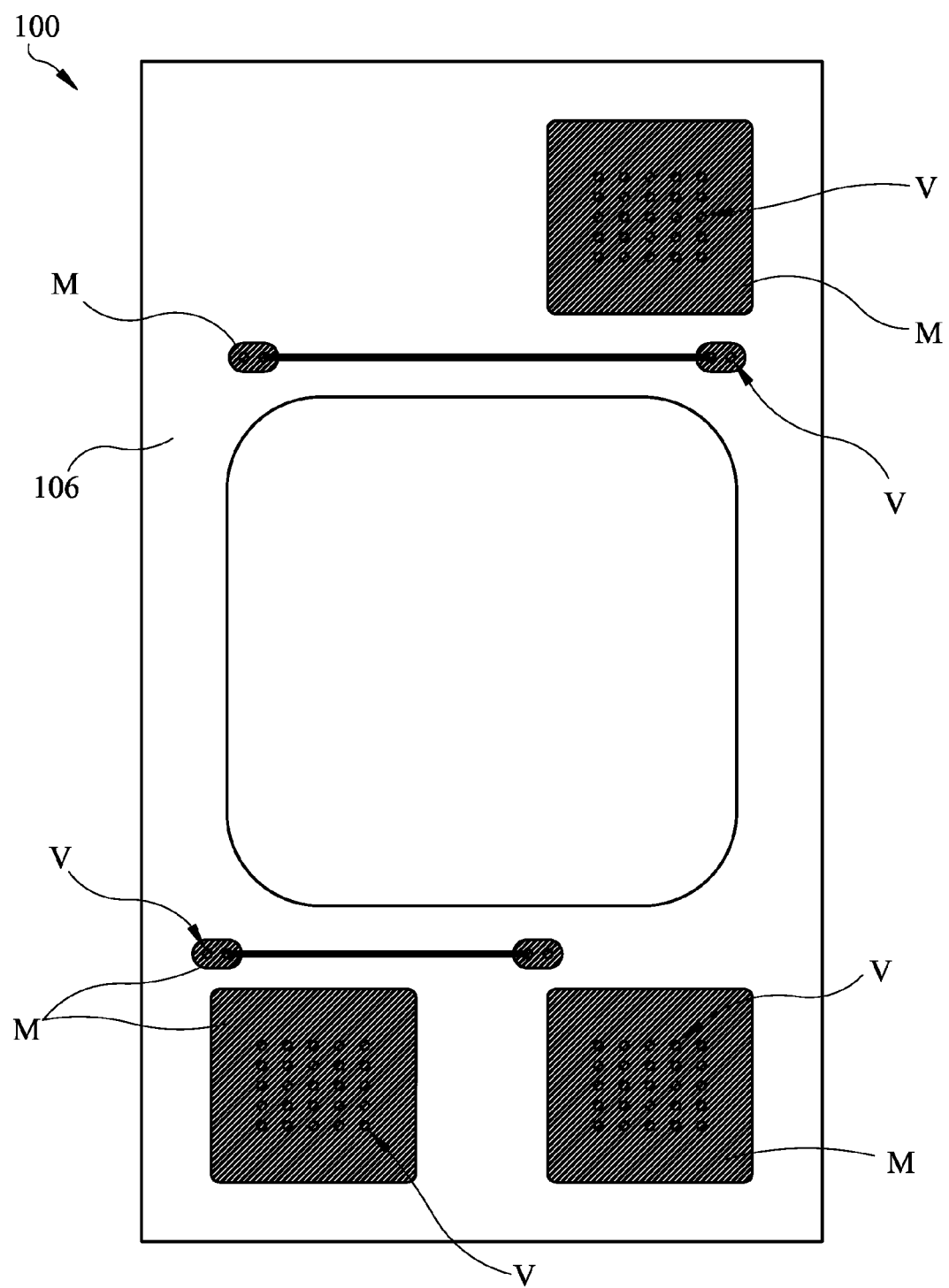
FIGS. 6A to 6C are various planar views of a solid state lighting apparatus associated circuitry on or over a substrate according to some aspects.
Figure 6B:
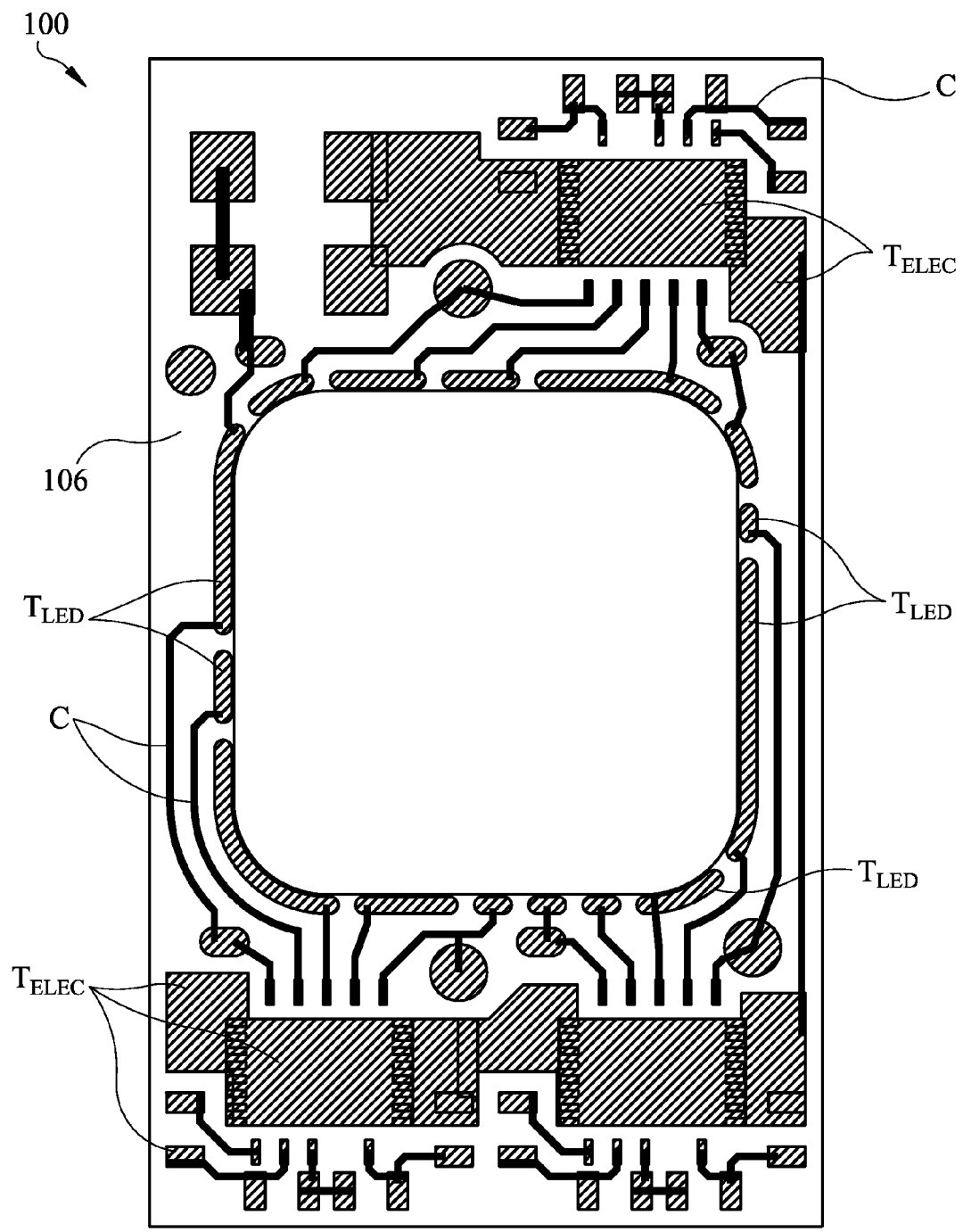
Figure 6C:
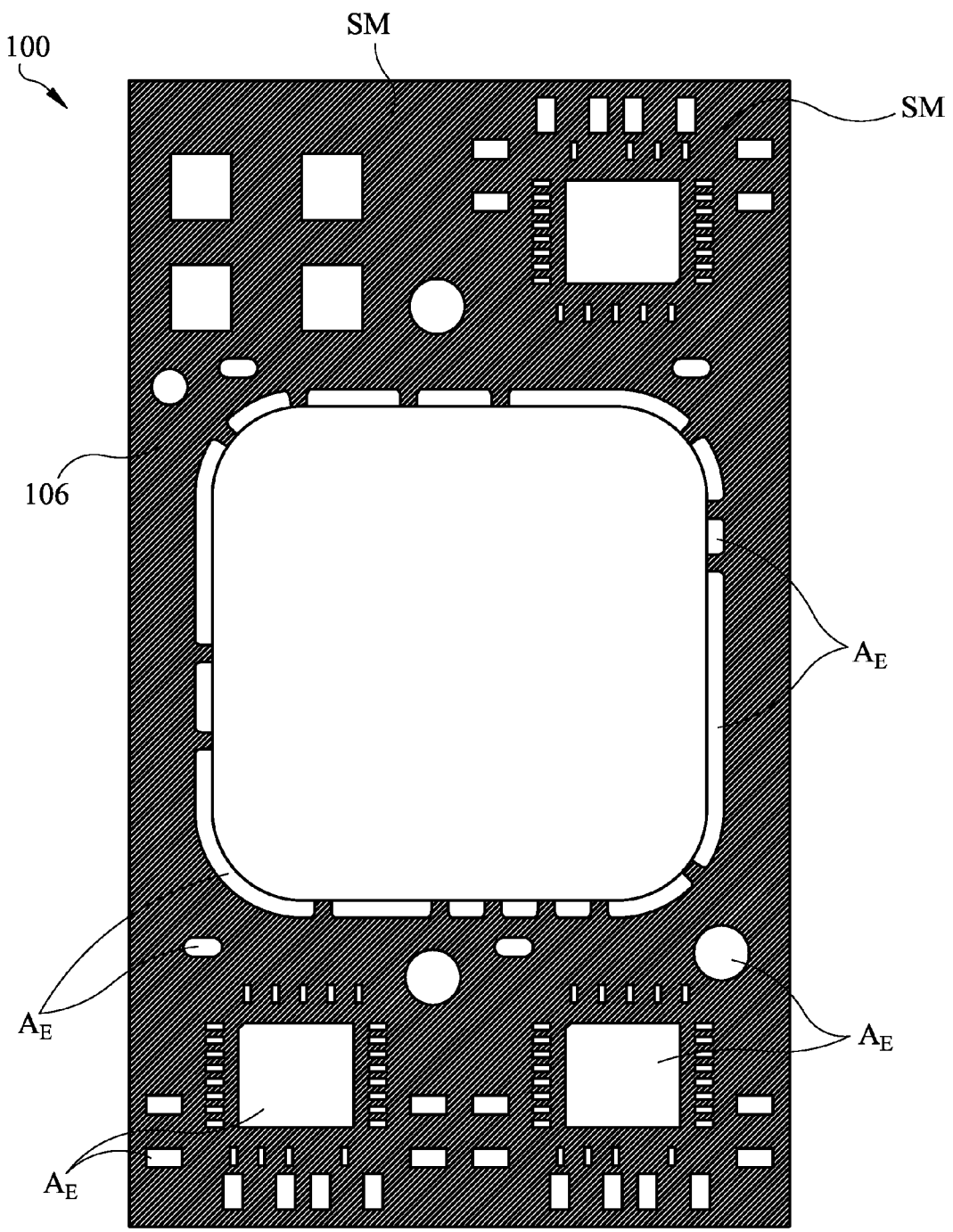

FIGS. 6A to 6C illustrate various schematic planar surfaces and/or layers of apparatus 100 and substrate 106. Referring to FIG. 6A, a first (e.g., bottom) layer of apparatus 100 and substrate 106 are illustrated. Along this layer or planar surface (area), a plurality of traces and/or areas of metal M are provided. Metal M can be applied over substrate 106 using any suitable technique, not limited to plating (e.g., electroplating, electroless plating, etc.), chemical, physical, or plasma vapor deposition (e.g., CVD or PECVD), sputtering, etc. Areas of metal M are configured to provide electrically conductive and/or thermally conductive surfaces. Metal M can provide contact surfaces, mounting surfaces, and/or thermal dissipation surfaces for various components of apparatus 100, such as components 102A to 102C (FIGS. 5A to 5E).

A plurality of electrically conductive vias V (through-holes) can be drilled and plated for providing electrical and/or thermal communication between non-coplanar surfaces such as metal M and traces (e.g., $T_{ELEC}$ and $T_{LED}$, FIG. 6B). In some aspects, vias V facilitate electrical communication through substrate 106 and apparatus 100. The electrical communication can transmit electrical signal to LED chips for illuminating the chips and/or any of the other electrical components disposed on substrate 106 (e.g., driving components/circuitry, resistors, etc.). Areas of metal M may be connected via one or more connectors C. Connectors C can comprise thin areas of deposited metal, metal traces, electrically conductive wire or any other suitable electrically conductive connector.

FIG. 6B illustrates another portion or planar surface (area) of apparatus 100 than that shown in FIG. 6A. For example and in some aspects, the planar surface shown in FIG. 6B is disposed above the planar surface shown in FIG. 6A. FIG. 6B is a view of various electrical traces and connectors C configured to supply electrical signal to LED chips and/or any other electrical components of apparatus 100. The traces for supplying power to LED chips are designated $T_{LED}$, and traces for supplying power to electrical components (see e.g., FIGS. 5A to 5E, drive components (102A to 102C), resistors (R), terminals (104A, 104B), etc.) are designated $T_{ELEC}$. LED traces $T_{LED}$ are disposed about light emitter area 108 (FIGS. 5A to 5E) and comprise areas to which strings of LED chips connect, for example, using wires, wire bonds, and/or any other suitable connector. LED traces $T_{LED}$ can be disposed below retention dam or structure (e.g., RS, FIG. 5A) to prevent damage thereto and/or corrosion thereof. Traces for electrical components $T_{ELEC}$ can provide mounting surfaces or areas of substrate 106 to which electrical components may physically and electrically connect to substrate 106. The LED chips, electrical components, and/or respective traces can communicate via connectors C, which can comprise thin traces, wires, or any other suitable electrically conductive material.

FIG. 6C illustrates a top portion or plane of apparatus 100 and substrate 106 indicating areas to which a solder mask SM is applied. Solder mask SM can comprise an optically reflective material for maximizing light reflection and extraction from apparatus 100 during operation. Areas of exposed metal $A_E$ may be left uncovered via masking during solder mask SM deposition. Areas of exposed metal $A_E$ can comprise areas to which LED chips mount or connect (e.g., traces, $T_{LED}$) and/or areas to which electrical components mount or connect. In the final form of apparatus 100, areas of exposed metal $A_E$ will either be covered by a physical component (e.g., 102A to 102C, R, 104A, 104B, FIG. 5A to 5E, etc.), retention structure (e.g., RS, FIG. 5A), or filling material (e.g., 110, FIG. 5A) to prevent such areas from degrading or corroding.

FIGS. 7A to 7D illustrate exemplary schematic circuit diagrams associated with LED chips (e.g., 112) disposed within a solid state lighting apparatus (e.g., 100, FIGS. 5A to 5E).

Figure 7A:
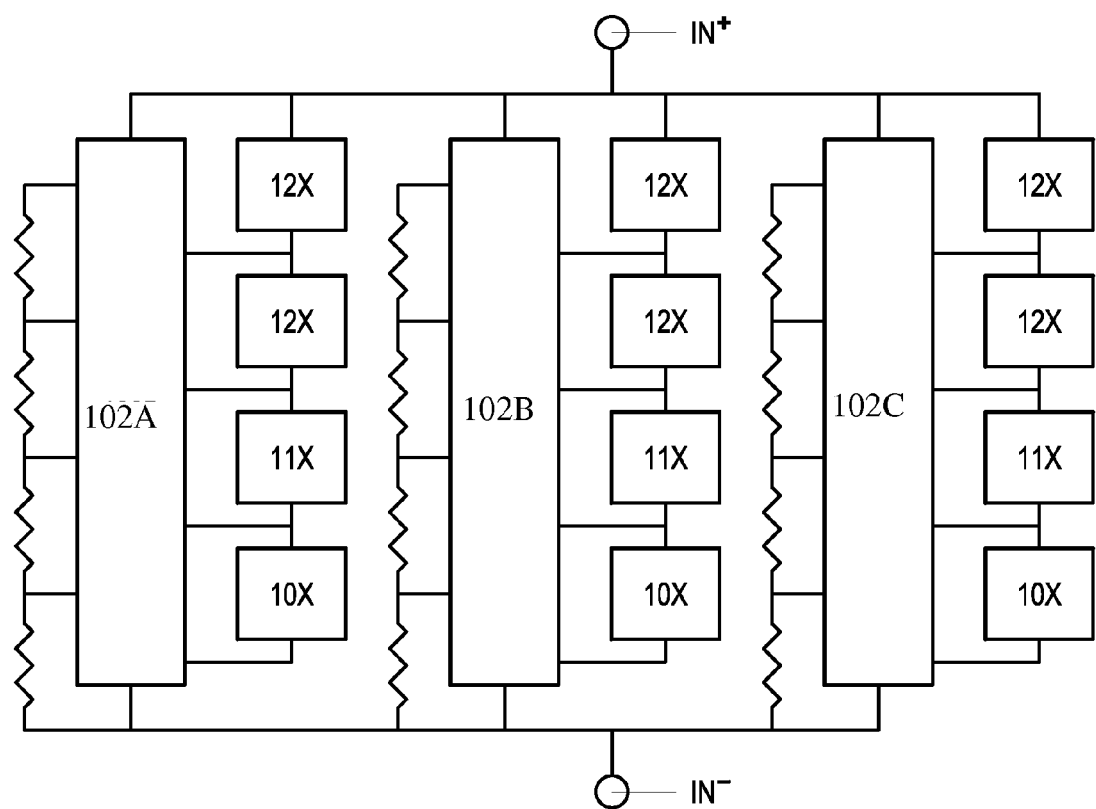
FIGS. 7A to 7E are exemplary schematic circuit diagrams of sold state emitters and respective drivers for solid state lighting apparatuses according to some aspects.

As FIG. 7A illustrates, in some aspects, three sets of 45 LED chips can be disposed within a solid state lighting apparatus. Each set of LED chips can be comprised of four serially connected strings of. Each of the three sets can be controlled by a different driving component 102A, 102B, and 102C. The three sets can then be disposed in parallel between a rectified AC power source. The first set powered by drive component 102A comprises four serially connected strings of LED chips, the first two strings have 12 chips, one string has 11 chips, and one string has 10 chips. The second and third sets controlled by drive components 102B and 102C can comprise a same configuration.

Figure 7B:
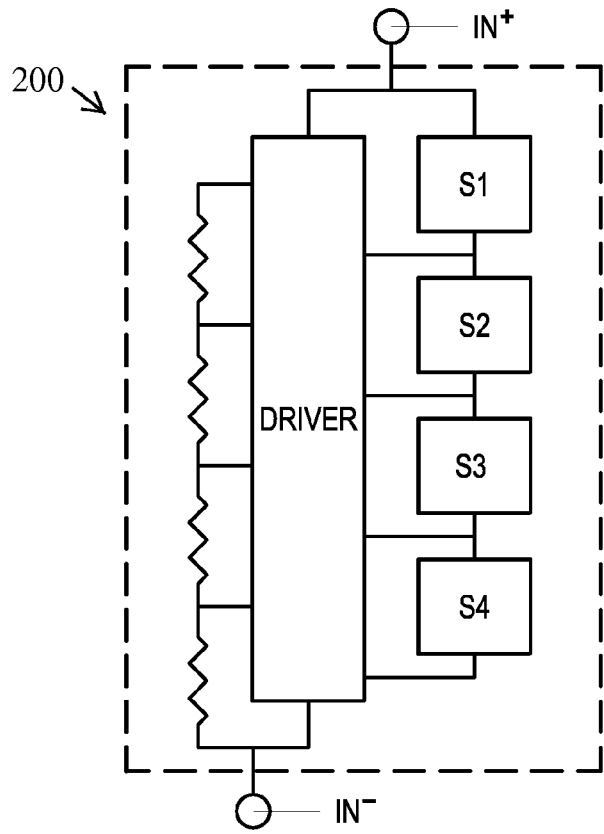

FIG. 7B is an exemplary schematic circuit diagram of a basic driver-LED chip building block, generally designated 200. Each building block 200 can comprise at leas tone one driver (e.g., 102A to 102C, FIGS. 5A to 5E), and multiple strings of serially connected LED chips, generally designated S1 to S4. Multiple building blocks 200 can be connected in series, or in parallel. The strings S1 to S4 of each building block 200 can also be connected in series, parallel, or combinations thereof.

Figure 7D:
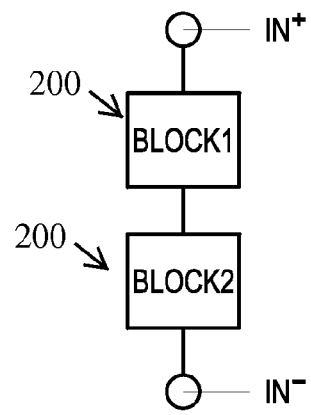
Figure 7C:
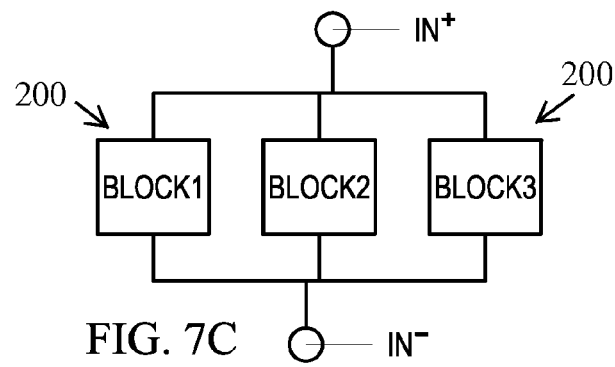

FIGS. 7C and 7D are schematic block diagrams of various configurations of a plurality of building blocks 200. In FIG. 7C, a plurality of building blocks 200 is provided, where each building block 200 is electrically connected in parallel between a current source (e.g., rectified AC or DC current). The individual blocks 200 can be operable at any voltage according to design, chip/junction count, set resistors, etc.

In FIG. 7D, a plurality of building blocks 200 is provided, where each building block 200 is electrically connected in series between a current source (e.g., rectified AC or DC current). The individual blocks 200 can be operable at any voltage according to design, chip/junction count, set resistors, etc. Connecting blocks 200 in series allows two 120 V blocks to sum to one 240 V apparatus.

Figure 7E:
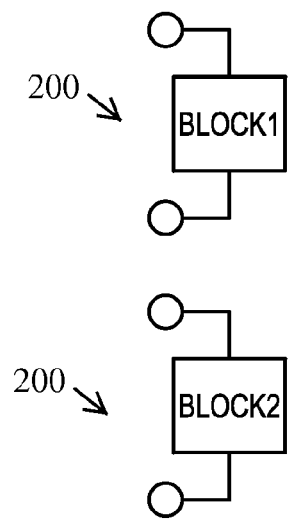

FIG. 7E illustrates a schematic block diagram of a configurable system or apparatus 210, in which one or more blocks 200 may be bypassed, shunted, powered "off", or "on". This is useful in general dimming and dim-to-warm applications.

What is claimed is:

1. A solid state lighting apparatus comprising:
a substrate;
an array of solid state light emitters arranged on or over the substrate;
a plurality of driving components arranged on or over the substrate, wherein each driving component is configured to independently activate and deactivate different solid state light emitters of the array of solid state light emitters during a portion of an alternating current (AC) cycle; and
terminals by which a user can select a series or parallel connection for the plurality of driving components.

2. The solid state lighting apparatus of claim 1, wherein the apparatus is selectively configurable for operability at between approximately 120 Volts (V) and approximately 240 V of AC current.

3. The solid state lighting apparatus of claim 1, wherein the apparatus comprises two or more driving components.

4. The solid state lighting apparatus of claim 1, wherein the apparatus comprises three or more driving components.

5. The solid state lighting apparatus of claim 1, wherein a first driving component is configured to illuminate a first set of solid state light emitters and wherein a second driving component is configured to illuminate a second, different set of solid state light emitters.

6. The solid state lighting apparatus of claim 5, wherein the first and second sets of solid state light emitters target different color temperatures ranging between approximately 1800K and 6000K.

7. The solid state lighting apparatus of claim 5, wherein the first and second sets of solid state light emitters comprise a plurality of strings of serially connected solid state light emitters, and where each string of the plurality of strings is operable to emit a different color temperature ranging between approximately 1800K and 6000K.

8. The solid state lighting apparatus of claim 1, wherein the plurality of driving components are electrically connected in series.

9. The solid state lighting apparatus of claim 1, wherein the plurality of driving components are electrically connected in parallel.

10. The solid state lighting apparatus of claim 1, wherein the substrate comprises a printed circuit board.

11. The solid state lighting apparatus of claim 1, wherein the substrate comprises Alumina, and wherein the array of solid state light emitters is arranged on the substrate.

12. A method of providing a solid state lighting apparatus, the method comprising:
providing a substrate;
mounting an array of solid state light emitters on or over the substrate;
providing a plurality of independent driving components on or over the substrate, wherein the driving components are configured to independently activate and deactivate at least some solid state emitters of the array of solid state light emitters during a portion of an alternating current (AC) cycle; and
providing terminals by which a user can select a series or parallel connection for the plurality of driving components.

13. The method of claim 12, further comprising selectively configuring the apparatus for operability at between approximately 120 Volts (V) and approximately 240 V of AC current.

14. The method of claim 12, further comprising providing two or more driving components.

15. The method of claim 12, further comprising providing three or more driving components.

16. The method of claim 12, further comprising illuminating a first set of solid state light emitters via a first driving component, and further comprising illuminating a second set of solid state light emitters via a second, different driving component.

17. The method of claim 16, wherein the first and second sets of solid state light emitters target different color temperatures ranging between approximately 1800K and 6000K.

18. The method of claim 16, wherein the first and second sets of solid state light emitters comprise a plurality of strings of serially connected solid state light emitters, and where each string of the plurality of strings is operable to emit a different color temperature ranging between approximately 1800K and 6000K.

19. The method of claim 12, wherein the plurality of driving components are electrically connected in series or in parallel.

20. The method of claim 12, wherein the substrate comprises a printed circuit board.

21. The method claim 12, wherein the substrate comprises Alumina, and wherein the array of solid state light emitters is arranged on the substrate.

22. A solid state lighting system comprising:
a solid state lighting apparatus comprising:
an array of solid state light emitters arranged on or over the substrate;
at least three driving components arranged on or over the substrate for independently activating different sets of sold state light emitters during a portion of an alternating current (AC) cycle; and
terminals by which a user can select a series or parallel connection for the at least three driving components; and
a rectifying circuit for rectifying electrical current supplied to the driving components.

23. The system of claim 22, wherein the solid state light emitters target a color temperature ranging between approximately 1800K and 6000K.

24. The solid state lighting system of claim 22, wherein the at least three driving components are electrically connected in series or in parallel.

25. A solid state lighting apparatus comprising:
a substrate;
an emitter area arranged on or over the substrate comprising an array of solid state light emitters, wherein the emitter area comprises an at least generally square surface area of approximately 300 mm² or more; and
a plurality of driving components arranged on or over the substrate, wherein each driving component is configured to independently activate and deactivate different solid state light emitters of the array of solid state light emitters during a portion of an alternating current (AC) cycle.

26. The solid state lighting apparatus of claim 25, wherein the apparatus comprises three or more driving components.

27. The solid state lighting apparatus of claim 25, wherein more than 120 light emitting diode (LED) chips are disposed over the surface area.

28. The solid state lighting apparatus of claim 25, wherein more than 120 junctions are disposed over the surface area.

29. The solid state lighting apparatus of claim 25, wherein the apparatus comprises 12 strings of serially connected LED chips disposed over the surface area.

30. The solid state lighting apparatus of claim 25, wherein the apparatus is operable at less than approximately 50 Watts (W).

31. The solid state lighting apparatus of claim 25, wherein the apparatus is operable at 50 Watts (W) or more.

32. The solid state lighting apparatus of claim 25, wherein the array of solid state light emitters target a color temperature ranging between approximately 1800K and 6000K.

33. The solid state lighting apparatus of claim 25, wherein the apparatus emits 120 lumens per watt (LPW) or more at approximately 55° C.

34. The solid state lighting apparatus of claim 25, wherein the apparatus emits 120 lumens per watt (LPM) or more at an elevated temperature range of approximately 55° C. to 100° C.

35. The solid state lighting apparatus of claim 25, wherein each sold state light emitter comprises an LED chip that is approximately 685 µm×1135 µm.

36. The solid state lighting apparatus of claim 25, wherein each sold state light emitter comprises a multi-junction LED chip.

37. The solid state lighting apparatus of claim 25, wherein the substrate comprises a surface area of approximately 980 mm² or more.

38. A lighting fixture incorporating the solid state lighting apparatus of claim 25.

39. The lighting fixture of claim 38, comprising a down light, a street light, a high-bay light, or a low-bay light.

40. A solid state lighting system comprising:
a solid state lighting apparatus comprising:
a substrate;
an array of solid state light emitters arranged on or over the substrate;
a plurality of driving components arranged on or over the substrate, wherein each driving component is configured to independently activate and deactivate different solid state light emitters of the array of solid state light emitters upon receipt of rectified alternating current (AC) or direct current (DC) from a current-source; and
terminals by which a user can select a series or parallel connection for the plurality of driving components.

41. The system of claim 40, wherein a circuit board provides the rectified AC.

42. The system of claim 40, wherein a circuit board provides the DC.

* * * * *